(12) United States Patent
Chen et al.

(10) Patent No.: US 12,368,120 B2
(45) Date of Patent: Jul. 22, 2025

(54) SEMICONDUCTOR DEVICE AND METHOD

(71) Applicant: Taiwan Semiconductor Manufacturing Co., Ltd., Hsinchu (TW)

(72) Inventors: Chen-Shien Chen, Zhubei (TW); Ting-Li Yang, Tainan (TW); Po-Hao Tsai, Taoyuan (TW); Chien-Chen Li, Hsinchu (TW); Ming-Da Cheng, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/526,057

(22) Filed: Dec. 1, 2023

(65) Prior Publication Data
US 2024/0096827 A1    Mar. 21, 2024

Related U.S. Application Data

(63) Continuation of application No. 17/323,506, filed on May 18, 2021, now Pat. No. 11,862,588.
(Continued)

(51) Int. Cl.
*H01L 23/31* (2006.01)
*H01L 23/00* (2006.01)

(52) U.S. Cl.
CPC .......... *H01L 24/05* (2013.01); *H01L 23/3171* (2013.01); *H01L 24/03* (2013.01); *H01L 24/16* (2013.01); *H01L 2224/02311* (2013.01); *H01L 2224/02313* (2013.01); *H01L 2224/0236* (2013.01); *H01L 2224/02373* (2013.01); *H01L 2224/02381* (2013.01); *H01L 2224/0401* (2013.01); *H01L 2224/16225* (2013.01)

(58) Field of Classification Search
CPC ...................................................... H01L 24/05
See application file for complete search history.

(56) References Cited

U.S. PATENT DOCUMENTS 6,465,886 B1 * 10/2002 Horiuchi ................. H01L 24/02
257/784
7,838,424 B2    11/2010 Karta et al.
(Continued)

FOREIGN PATENT DOCUMENTS

JP       2008034694 A    2/2008
KR    20140026463 A    3/2014
(Continued)

*Primary Examiner* — William A Harriston
(74) *Attorney, Agent, or Firm* — Slater Matsil, LLP

(57) ABSTRACT

In an embodiment, a device includes: a passivation layer on a semiconductor substrate; a first redistribution line on and extending along the passivation layer; a second redistribution line on and extending along the passivation layer; a first dielectric layer on the first redistribution line, the second redistribution line, and the passivation layer; and an under bump metallization having a bump portion and a first via portion, the bump portion disposed on and extending along the first dielectric layer, the bump portion overlapping the first redistribution line and the second redistribution line, the first via portion extending through the first dielectric layer to be physically and electrically coupled to the first redistribution line.

20 Claims, 17 Drawing Sheets

Related U.S. Application Data

(60) Provisional application No. 63/137,343, filed on Jan. 14, 2021.

(56) References Cited

U.S. PATENT DOCUMENTS

| | | | |
|---|---|---|---|
| 7,863,742 B2 | 1/2011 | Yu et al. | |
| 7,932,601 B2 | 4/2011 | Chang et al. | |
| 7,977,789 B2* | 7/2011 | Park | H01L 24/03 |
| | | | 257/737 |
| 8,754,508 B2 | 6/2014 | Chen et al. | |
| 8,772,151 B2 | 7/2014 | Chen | |
| 8,846,548 B2 | 9/2014 | Tu et al. | |
| 9,741,651 B1* | 8/2017 | Reingruber | H01L 21/4846 |
| 10,141,288 B2 | 11/2018 | Hsieh et al. | |
| 11,075,173 B2 | 7/2021 | Tseng et al. | |
| 12,107,058 B2* | 10/2024 | Zuo | H01L 24/13 |
| 2009/0283903 A1* | 11/2009 | Park | H01L 24/03 |
| | | | 257/737 |
| 2010/0032843 A1* | 2/2010 | Chen | H01L 24/05 |
| | | | 257/E23.068 |
| 2011/0254154 A1 | 10/2011 | Topacio et al. | |
| 2013/0134580 A1* | 5/2013 | Bao | H01L 24/05 |
| | | | 257/737 |
| 2013/0341800 A1 | 12/2013 | Tu et al. | |
| 2014/0015122 A1 | 1/2014 | Chou et al. | |
| 2014/0045379 A1 | 2/2014 | Chen | |
| 2014/0048926 A1 | 2/2014 | Wang et al. | |
| 2014/0077356 A1 | 3/2014 | Chen et al. | |
| 2014/0167269 A1 | 6/2014 | Lu et al. | |
| 2014/0183693 A1 | 7/2014 | Tsai et al. | |
| 2014/0187103 A1 | 7/2014 | Chen et al. | |
| 2014/0252558 A1 | 9/2014 | Yu et al. | |
| 2014/0252597 A1 | 9/2014 | Tsai et al. | |
| 2014/0252601 A1 | 9/2014 | Lu et al. | |
| 2014/0252608 A1 | 9/2014 | Chen et al. | |
| 2014/0262468 A1 | 9/2014 | Chen et al. | |
| 2014/0264885 A1 | 9/2014 | Tsai et al. | |
| 2015/0228594 A1* | 8/2015 | Alvarado | H01L 24/05 |
| | | | 257/737 |
| 2019/0067229 A1* | 2/2019 | Mohammed | H01L 24/03 |
| 2020/0266136 A1 | 8/2020 | Lee | |
| 2024/0030173 A1* | 1/2024 | Fang | H01L 24/11 |

FOREIGN PATENT DOCUMENTS

| | | |
|---|---|---|
| KR | 20170015053 A | 2/2017 |
| KR | 20200050417 A | 5/2020 |
| TW | 201423941 A | 6/2014 |
| WO | 2019044857 A1 | 3/2019 |

* cited by examiner

SEMICONDUCTOR DEVICE AND METHOD

PRIORITY CLAIM AND CROSS-REFERENCE

This application is a continuation of U.S. patent application Ser. No. 17/323,506, filed on May 18, 2021, entitled "Semiconductor Device and Method," which claims the benefit of U.S. Provisional Application No. 63/137,343, filed on Jan. 14, 2021, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
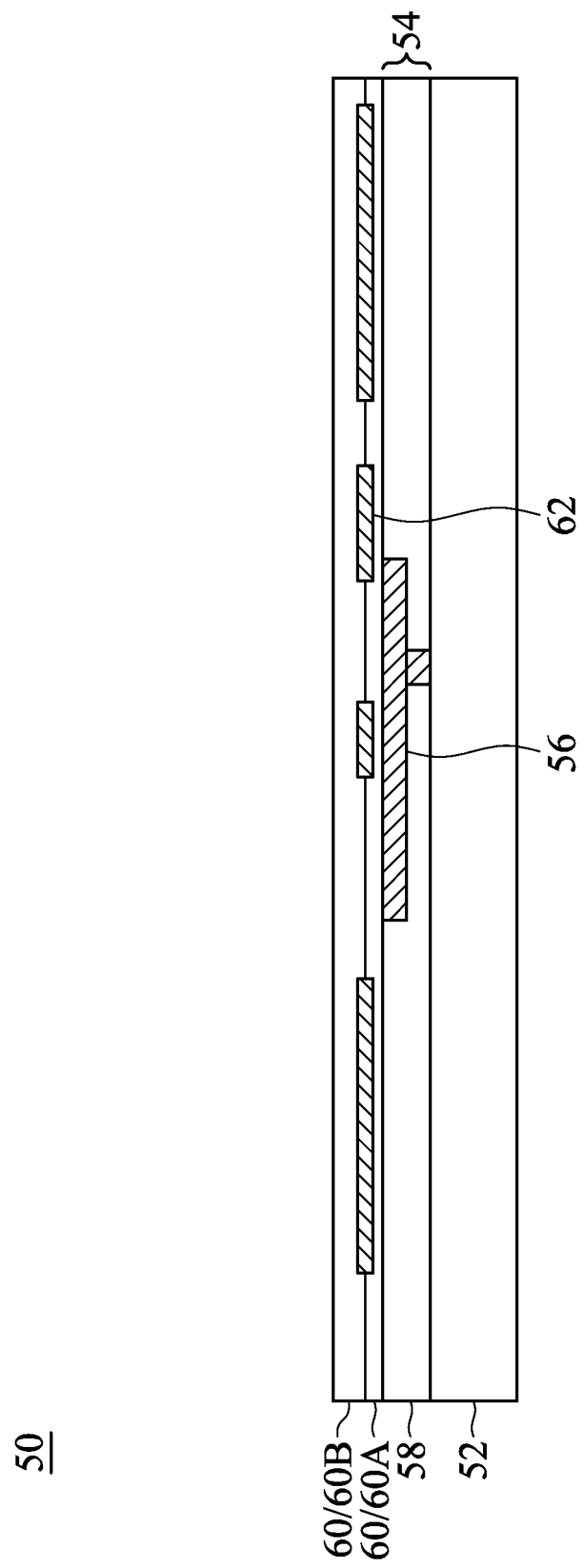
FIGS. 1 through 7 are cross-sectional views of intermediate stages in the manufacturing of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with various embodiments, redistribution lines are formed over a semiconductor substrate, and UBMs are formed coupled to the redistribution lines. The UBMs are formed to a large width such that they overlap multiple underlying redistribution lines, optionally including underlying redistribution lines to which the UBMs are not coupled (e.g., dummy redistribution lines or other functional redistribution lines). Forming the UBMs to a large size allows for a greater contact area (which may reduce contact resistance) and allows for greater flexibility in the routing of the redistribution lines.

FIGS. 1 through 7 are cross-sectional views of intermediate stages in the manufacturing of an integrated circuit die 50, in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die), the like, or combinations thereof. The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits.

In FIG. 1, a semiconductor substrate 52 is provided. The semiconductor substrate 52 may be silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side. Devices are formed at the active surface of the semiconductor substrate 52. The devices may be active devices (e.g., transistors, diodes, etc.) or passive devices (e.g., capacitors, inductors, resistors, etc.). The inactive surface may be free of devices.

An interconnect structure 54 is formed over the active surface of the semiconductor substrate 52, and is used to electrically connect the devices of the semiconductor substrate 52 to form an integrated circuit. The interconnect structure 54 may include one or more dielectric layer(s) and respective metallization pattern(s) in the dielectric layer(s). Acceptable dielectric materials for the dielectric layers include oxides such as silicon oxide, aluminum oxide, or the like; nitrides such as silicon nitride; carbides such as silicon carbide; combinations thereof; or the like. The dielectric layer(s) may be formed of low-k (LK) dielectrics such as carbon doped oxides, extremely low-k (ELK) dielectrics such as porous carbon doped silicon dioxide, or the like. Other acceptable dielectric materials include photosensitive polymers such as polyimide, polybenzoxazole (PBO), a benzocyclobutene (BCB) based polymer, combinations thereof, or the like. The metallization patterns may include conductive vias and/or conductive lines to interconnect the devices of the semiconductor substrate 52. The metallization patterns may be formed of a conductive material, such as a metal, such as copper, cobalt, aluminum, gold, combinations thereof, or the like. The interconnect structure 54 may be formed by a damascene process, such as a single damascene process, a dual damascene process, or the like.

Contact pads 56 are formed at the front side of the integrated circuit die 50. The contact pads 56 may be pads, conductive pillars, or the like, to which external connections are made. The contact pads 56 are in and/or on the interconnect structure 54. For example, the contact pads 56 may be part of an upper metallization pattern of the interconnect structure 54. When the contact pads 56 are part of the upper metallization pattern of the interconnect structure 54, the upper metallization pattern can have a feature density of at least 20%. The contact pads 56 can be formed of a metal, such as copper, aluminum, or the like, and can be formed by, for example, plating, or the like.

A dielectric layer 58 is at the front side of the integrated circuit die 50. The dielectric layer 58 is in and/or on the interconnect structure 54. For example, the dielectric layer 58 may be an upper dielectric layer of the interconnect structure 54. The dielectric layer 58 laterally surrounds the contact pads 56. The dielectric layer 58 may be an oxide, a nitride, a carbide, a polymer, the like, or a combination thereof. The dielectric layer 58 may be formed, for example, by spin coating, lamination, chemical vapor deposition (CVD), or the like.

In some embodiments (not separately illustrated), the integrated circuit die 50 is a stacked device that includes multiple semiconductor substrates 52. For example, the integrated circuit die 50 may be a memory device that includes multiple memory dies, such as a hybrid memory cube (HMC) module, a high bandwidth memory (HBM) module, or the like. In such embodiments, the integrated circuit die 50 includes multiple semiconductor substrates 52 interconnected by through-substrate vias (TSVs), such as through-silicon vias. Each of the semiconductor substrates 52 may (or may not) have an interconnect structure 54.

One or more passivation layer(s) 60 are formed on the dielectric layer 58 and the contact pads 56 (e.g., on the interconnect structure 54). In the illustrated embodiment, the passivation layer(s) 60 include a first passivation layer 60A on the interconnect structure 54, and a second passivation layer 60B on the first passivation layer 60A. The passivation layer(s) 60 may be formed of one or more acceptable dielectric materials, such as silicon oxide, silicon nitride, low-k (LK) dielectrics such as carbon doped oxides, extremely low-k (ELK) dielectrics such as porous carbon doped silicon dioxide, combinations thereof, or the like. Other acceptable dielectric materials include photosensitive polymers such as polyimide, polybenzoxazole (PBO), a benzocyclobutene (BCB) based polymer, combinations thereof, or the like. The passivation layer(s) 60 may be formed by deposition (e.g., CVD), spin coating, lamination, combinations thereof, or the like.

Passive devices 62 are optionally formed among the passivation layer(s) 60 (e.g., between the first passivation layer 60A and the second passivation layer 60B). The passive devices 62 include capacitors, inductors, resistors, and the like. In some embodiments, the passive devices are metal-insulator-metal (MIM) devices, such as super high density MIM (SHDMIM) devices.

As an example to form the passivation layer(s) 60 and the passive devices 62, the first passivation layer 60A may be deposited and recesses may be patterned in the first passivation layer 60A, such as by using an acceptable etching process. Once the recesses have been patterned in the first passivation layer 60A, a series of metal layers and insulating layers may be deposited within the recesses and over the first passivation layer 60A to form a three dimensional corrugated stack of metal layers separated by the insulating layers. The corrugated stack forms MIM devices. Contacts may be formed through the layers of the corrugated stack, electrically connecting the metal layers of the MIM devices to the metallization patterns of the interconnect structure 54 (e.g., to some of the contact pads 56). The passive devices 62 may thus be electrically coupled to the devices of the semiconductor substrate 52. The second passivation layer 60B may then be deposited on the passive devices 62 and the first passivation layer 60A.

Figure 2:
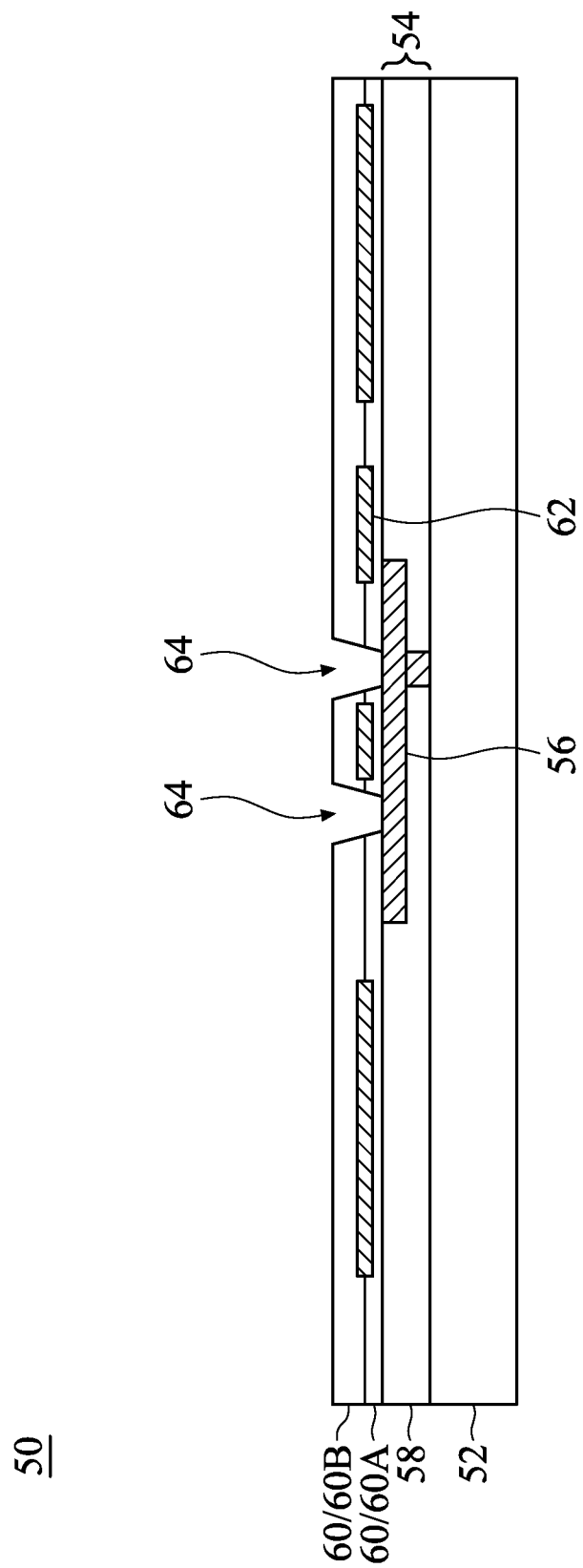

In FIG. 2, openings 64 are patterned in the passivation layer(s) 60 to expose portions of the contact pads 56. The patterning may be formed by an acceptable process, such as by exposing the passivation layer(s) 60 to light when they are formed of photosensitive material(s) or by etching the passivation layer(s) 60 using, for example, an anisotropic etch. If the passivation layer(s) 60 are formed of photosensitive material(s), they can be developed after the exposure. When the passive devices 62 are formed, the openings 64 can be patterned around the passive devices 62, such that the openings 64 are disposed between adjacent passive devices 62.

Figure 3:
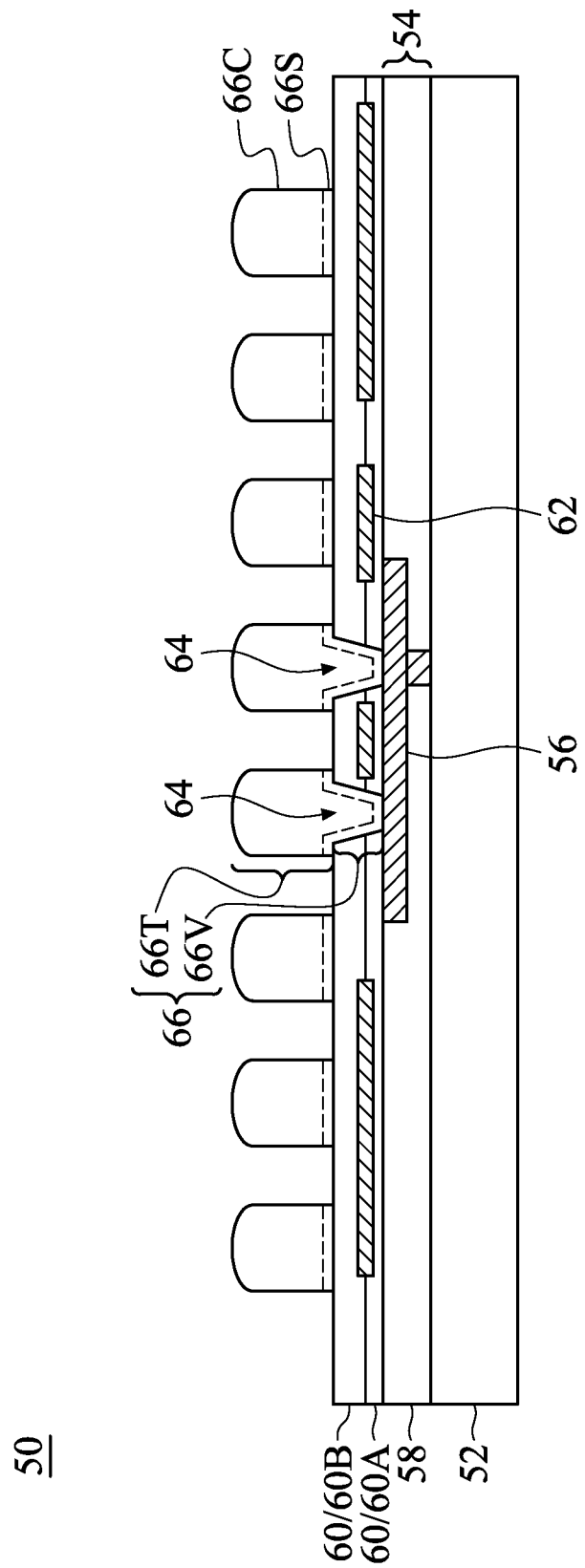

In FIG. 3, redistribution lines 66 are formed. The redistribution lines 66 have trace portions 66T on and extending along the top surface of the passivation layer(s) 60 (e.g., the top surface of the second passivation layer 60B). For example, the trace portions 66T are conductive lines that extend lengthwise parallel to a major surface of the semiconductor substrate 52. At least some of the redistribution lines 66 also have one or more via portions 66V in respective ones of the openings 64 (e.g., extending through the passivation layer(s) 60) that are physically and electrically coupled to the contact pads 56.

Figure 11:
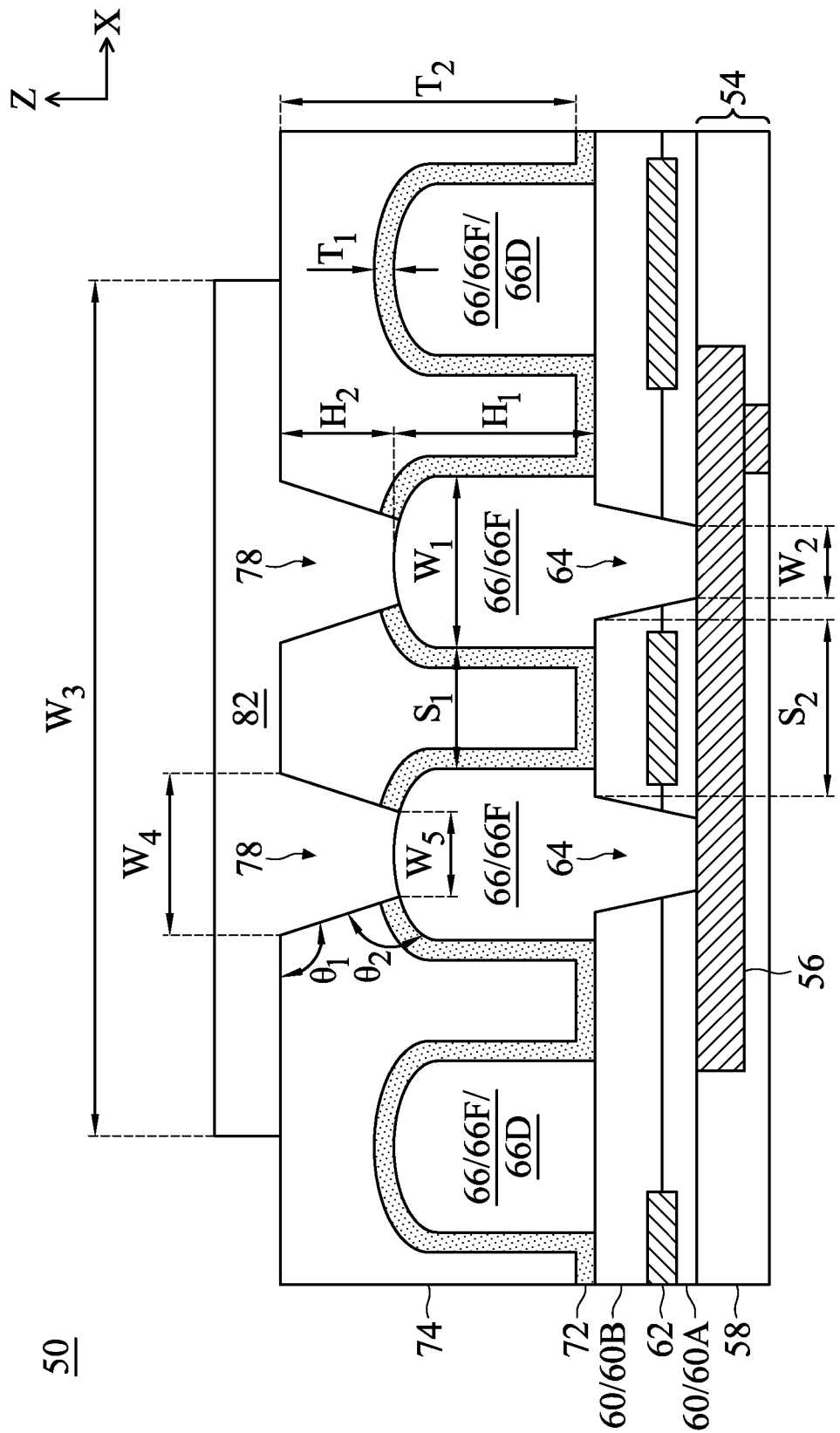
FIG. 11 is a detailed view of an integrated circuit die, in accordance with some embodiments.

Some of the redistribution lines 66 are functional redistribution lines 66F (see FIG. 11) and some redistribution lines 66 are dummy redistribution lines 66D (see FIG. 11). The functional redistribution lines 66F are electrically coupled to devices (e.g., the passive devices 62 and/or the devices of the semiconductor substrate 52), and may have both trace portions 66T and via portions 66V. The dummy redistribution lines 66D are not electrically coupled to devices (e.g., the passive devices 62 and/or the devices of the semiconductor substrate 52), and may have only trace portions 66T and may not have via portions 66V. The dummy redistribution lines 66D may provide mechanical support for under bump metallizations (UBMs) that will be subsequently formed over the dummy redistribution lines 66D.

As an example to form the redistribution lines 66, a seed layer 66S is formed on the top surface of the passivation layer(s) 60 and in the openings 64 (e.g., on the exposed portions of the contact pads 56). In some embodiments, the seed layer 66S is a metal layer, which may be a single layer or a composite layer including a plurality of sub-layers formed of different materials. In some embodiments, the seed layer 66S includes a titanium layer and a copper layer over the titanium layer. The seed layer 66S may be formed using, for example, physical vapor deposition (PVD) or the like. A photoresist (not separately illustrated) is then formed and patterned on the seed layer 66S. The photoresist may be formed by spin coating or the like and may be exposed to light for patterning. The pattern of the photoresist corresponds to the redistribution lines 66. The patterning forms openings through the photoresist to expose the seed layer 66S. A conductive material 66C is then formed in the openings of the photoresist and on the exposed portions of the seed layer 66S. The conductive material 66C may be formed by plating, such as electroplating or electroless plating, or the like. The conductive material 66C may include a metal, such as copper, silver, cobalt, titanium, tungsten, aluminum, combinations thereof, or the like. For example, the conductive material 66C may be copper, a copper-silver alloy, or a copper-cobalt alloy, plated using the seed layer 66S. Then, the photoresist and portions of the seed layer 66S on which the conductive material 66C is not formed are removed. The photoresist may be removed by an acceptable ashing or stripping process, such as using an oxygen plasma or the like. Once the photoresist is removed, exposed portions of the seed layer 66S are removed, such as by using an acceptable etching process. The remaining portions of the seed layer 66S and conductive material 66C form the redistribution lines 66.

The redistribution lines 66 may have any type of top surfaces, given the application of the integrated circuit die 50 to be formed. In the illustrated embodiment the redistribution lines 66 have convex top surfaces. In another embodiment, the redistribution lines 66 can have flat top surfaces, concave top surfaces, or polygonal top surfaces.

The trace portions 66T may also have any type of sidewalls, given the application of the integrated circuit die 50 to be formed. In the illustrated embodiment the trace portions 66T have substantially vertical sidewalls that are spaced apart by a constant width. In another embodiment, the trace portions 66T have sidewalls that are spaced apart by a tapering width that decreases in a direction extending away from the semiconductor substrate 52.

Figure 4:
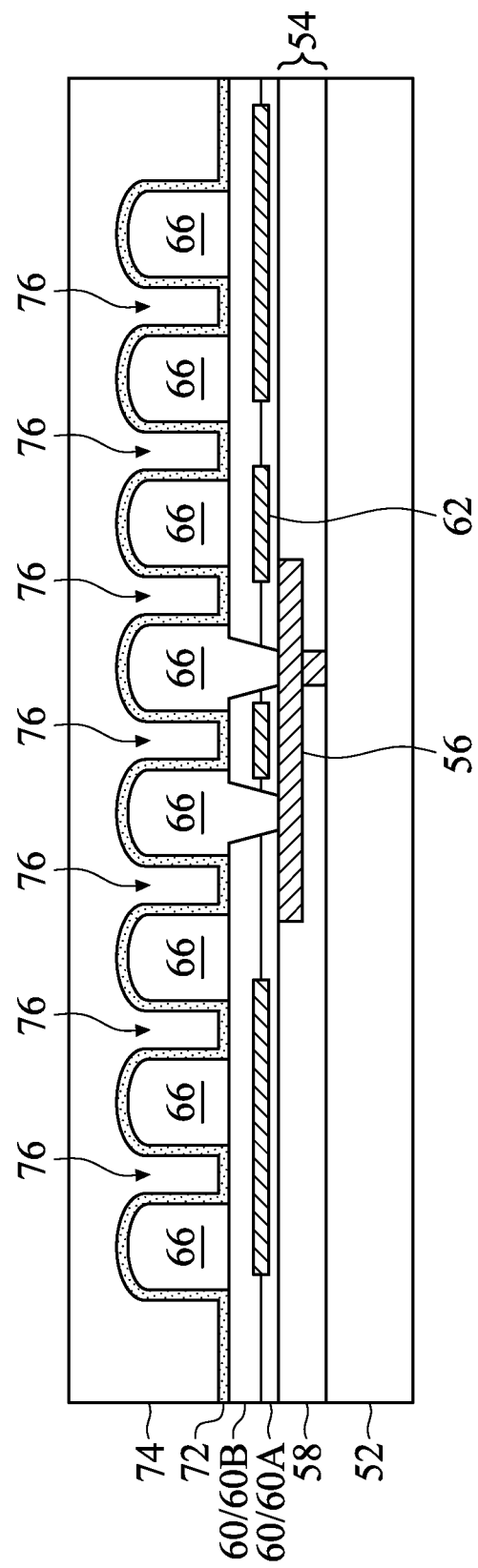

In FIG. 4, a dielectric layer 72 and/or a dielectric layer 74 are formed. One or both of the dielectric layers 72, 74 may be formed. In the embodiment described for FIG. 4, both of the dielectric layers 72, 74 are formed. In another embodiment (subsequently described for FIG. 12), the dielectric layer 74 is formed and the dielectric layer 72 is omitted. In yet another embodiment (subsequently described for FIG. 13), the dielectric layer 72 is formed and the dielectric layer 74 is omitted.

The dielectric layer 72 is formed on the redistribution lines 66 and the top surface of the passivation layer(s) 60. The dielectric layer 72 may be formed of one or more acceptable dielectric materials such as silicon oxide, silicon nitride, low-k (LK) dielectrics such as carbon doped oxides, extremely low-k (ELK) dielectrics such as porous carbon doped silicon dioxide, combinations thereof, or the like. Other acceptable dielectric materials include photosensitive polymers such as polyimide, polybenzoxazole (PBO), a benzocyclobutene (BCB) based polymer, combinations thereof, or the like. The dielectric layer 72 may be formed by deposition (e.g., CVD), spin coating, lamination, combinations thereof, or the like. In some embodiments, the dielectric layer 72 is a passivation layer. The dielectric layer 72 is formed to a thickness $T_1$ (see FIG. 11), which can be in the range of about 0.3 μm to about 3 μm.

The dielectric layer 74 is formed on the dielectric layer 72 (if present) or on the redistribution lines 66 and the top surface of the passivation layer(s) 60 (when the dielectric layer 72 is not present). The dielectric layer 74 may be formed of one or more acceptable dielectric materials, such as photosensitive polymers, such as polyimide, polybenzoxazole (PBO), a benzocyclobutene (BCB) based polymer, combinations thereof, or the like. Other acceptable dielectric materials include silicon oxide, silicon nitride, low-k (LK) dielectrics such as carbon doped oxides, extremely low-k (ELK) dielectrics such as porous carbon doped silicon dioxide, combinations thereof, or the like. The dielectric layer 74 may be formed by spin coating, lamination, deposition (e.g., CVD), combinations thereof, or the like. After the dielectric layer 74 is formed, it may be planarized, such as by chemical mechanical polishing (CMP), so that the front side of the integrated circuit die 50 is planar. The dielectric layer 74 is formed to a thickness $T_2$ (see FIG. 11), which can be in the range of about 5 μm to about 21 μm.

In some embodiments, the dielectric layer 72 is formed by a process that has good gap-filling properties. For example, the dielectric layer 72 may be formed of an oxide or a nitride by CVD or ALD, which can have step coverage in the range of about 20% to about 95%. In some embodiments, the dielectric layer 74 is formed by a process that has a low cost. For example, the dielectric layer 74 may be formed of a polyimide by spin coating. Forming both of the dielectric layers 72, 74 may allow the areas (e.g., gaps 76) between the redistribution lines 66 to be substantially filled, such that no voids remain between the redistribution lines 66, while low manufacturing costs are maintained.

Figure 5:
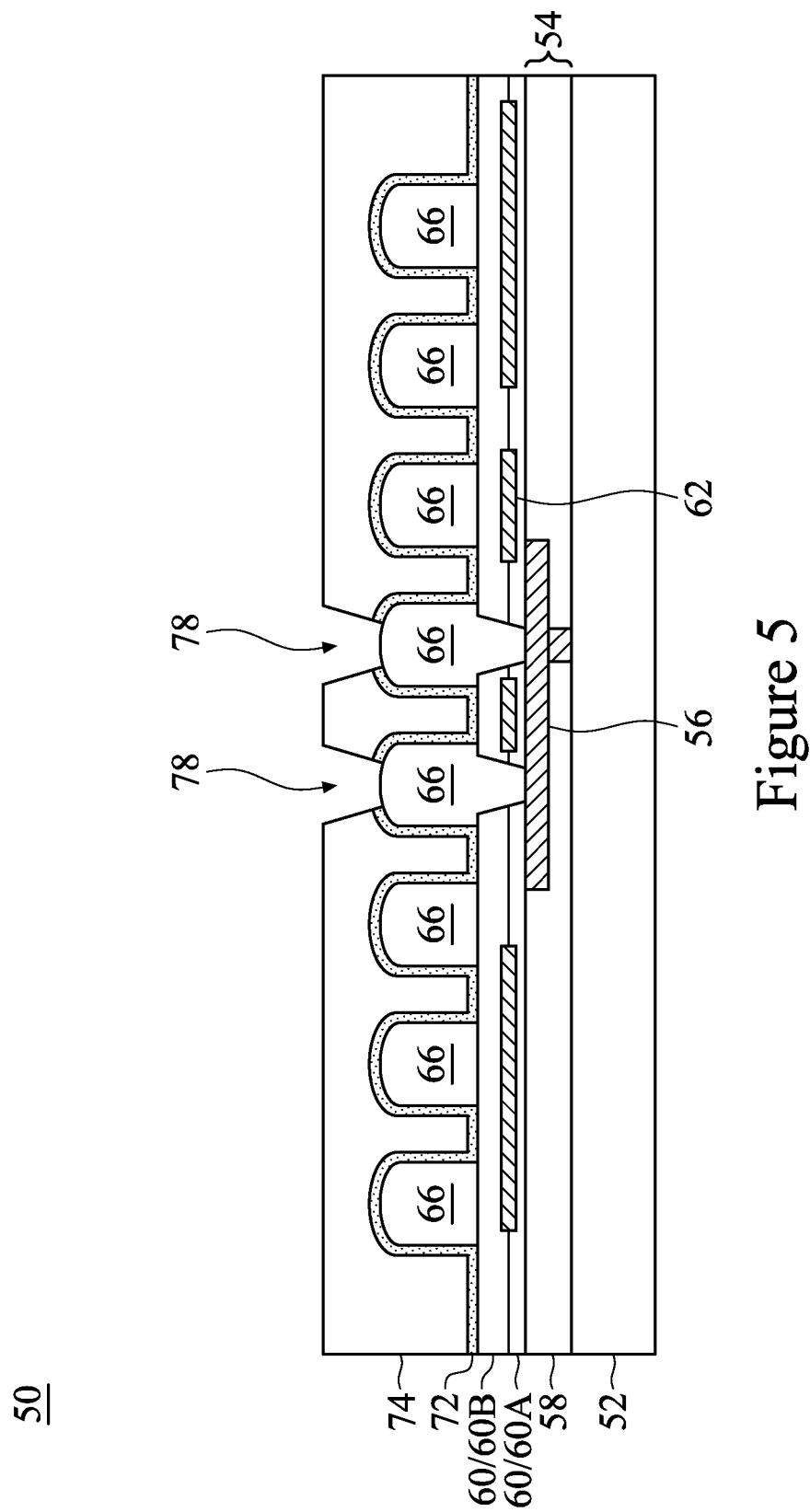

In FIG. 5, openings 78 are patterned in the dielectric layer 72 and/or the dielectric layer 74 to expose portions of the redistribution lines 66. The patterning may be formed by an acceptable process, such as by exposing the dielectric layer 72 and/or the dielectric layer 74 to light when they are formed of photosensitive material(s) or by etching the dielectric layer 72 and/or the dielectric layer 74 using, for example, an anisotropic etch. If the dielectric layer 72 and/or the dielectric layer 74 are formed of photosensitive material(s), they can be developed after the exposure. In some embodiments, the openings 78 are formed by an acceptable etch, such as an anisotropic etch, even when the dielectric layer 72 and/or the dielectric layer 74 are formed of photosensitive material(s). The widths of the openings 78 will be subsequently described in greater detail.

Figure 6:
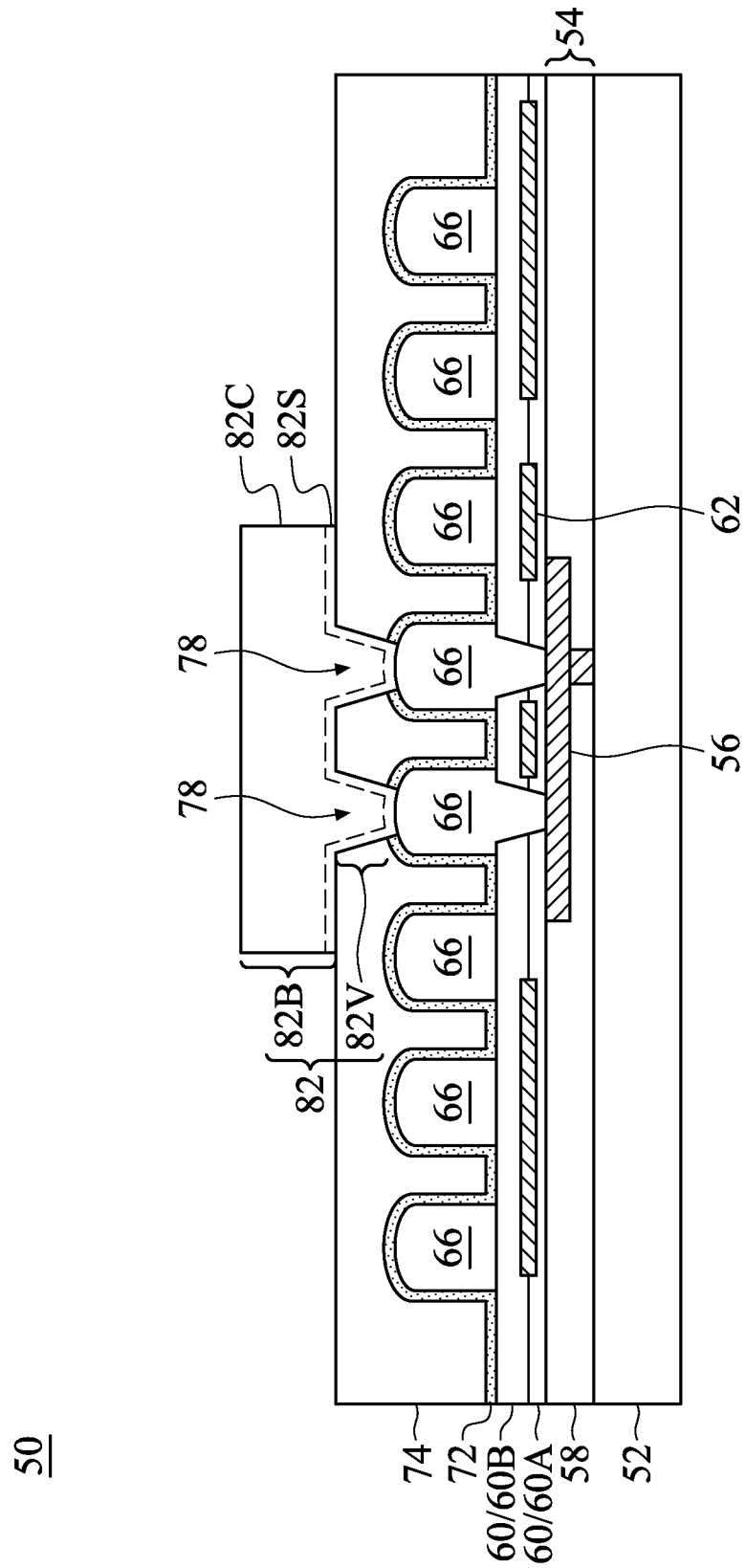

In FIG. 6, UBMs 82 are formed for external connection to the integrated circuit die 50. The UBMs 82 may be controlled collapse chip connection (C4) bumps, micro bumps, conductive pillars, electroless nickel-electroless palladium-immersion gold technique (ENEPIG) formed bumps, or the like. The UBMs 82 have bump portions 82B on and extending along the top surface of the dielectric layer 74 (if present) or the dielectric layer 72 (if present). The UBMs 82 also have via portions 82V in the openings 78 (e.g., extending through the dielectric layer 74 (if present) and/or the dielectric layer 72 (if present)) that are physically and electrically coupled to the redistribution lines 66. As a result, the UBMs 82 are electrically coupled to devices (e.g., the passive devices 62 and/or the devices of the semiconductor substrate 52). The UBMs 82 may be formed of the same material(s) as the redistribution lines 66. In some embodiments, the UBMs 82 have a different size than the redistribution lines 66. As will be subsequently described in greater detail, the UBMs 82 are formed to a large size, such that they overlap a plurality of the redistribution lines 66.

As an example to form the UBMs 82, a seed layer 82S is formed on the top surface of the dielectric layer 74 (if present) or the dielectric layer 72 (if present) and in the openings 78 (e.g., on the exposed portions of the redistribution lines 66). In some embodiments, the seed layer 82S is a metal layer, which may be a single layer or a composite layer including a plurality of sub-layers formed of different materials. In some embodiments, the seed layer 82S includes a titanium layer and a copper layer over the titanium layer. The seed layer 82S may be formed using, for example, PVD or the like. A photoresist (not separately illustrated) is then formed and patterned on the seed layer 82S. The photoresist may be formed by spin coating or the like and may be exposed to light for patterning. The pattern of the photoresist corresponds to the UBMs 82. The patterning forms openings through the photoresist to expose the seed layer 82S. A conductive material 82C is then formed in the openings of the photoresist and on the exposed portions of the seed layer 82S. The conductive material 82C may be formed by plating, such as electroplating or electroless plating, or the like. The conductive material 82C may include a metal, such as copper, titanium, tungsten, aluminum, gold, cobalt, or the like, plated using the seed layer 82S. Then, the photoresist and portions of the seed layer 82S on which the conductive material 82C is not formed are removed. The photoresist may be removed by an acceptable ashing or stripping process, such as using an oxygen plasma or the like. Once the photoresist is removed, exposed portions of the seed layer 82S are removed, such as by using an acceptable etching process. The remaining portions of the seed layer 82S and conductive material 82C form the UBMs 82.

In some embodiments, a metal cap layer is formed on the top surfaces of the UBMs 82. The metal cap layer may include nickel, tin, tin-lead, gold, silver, palladium, indium, nickel-palladium-gold, nickel-gold, the like, or a combination thereof and may be formed by a plating process.

The UBMs 82 may have any desired quantity of via portions 82V and may be coupled to any desired quantity of underlying redistribution lines 66, given the application of the integrated circuit die 50 to be formed. In the illustrated embodiment, a UBM 82 has a plurality of via portions 82V, with each via portion 82V of the UBM 82 being physically and electrically coupled to a corresponding underlying redistribution line 66, while other underlying redistribution lines 66 are physically and electrically separated from the UBM 82 by the dielectric layers 72, 74. In another embodiment, a UBM 82 has a single via portion 82V that is physically and electrically coupled to a single underlying redistribution line 66, such that other underlying redistribution lines 66 are physically and electrically separated from the UBM 82 by the dielectric layers 72, 74. In yet another embodiment, UBMs 82 with diverse quantities of via portions 82V are formed. For example, a first subset of the UBMs 82 may have a first quantity of via portions 82V (e.g., one via portion 82V), and a second subset of the UBMs 82 may have a second quantity of via portions 82V (e.g., more than one via portions 82V), with the first quantity being different from the second quantity. As will be subsequently described in greater detail, each via portion 82V of a UBM 82 is disposed directly over a via portion 66V of the corresponding underlying redistribution line 66. When a UBM 82 is coupled to multiple underlying redistribution lines 66, those redistribution lines 66 may each be coupled to a same contact pad 56 (as illustrated) or to different contact pads 56 (not separately illustrated).

Further, the UBMs 82 may be coupled to underlying redistribution lines 66 that are routed in any manner, given the application of the integrated circuit die 50 to be formed. In the illustrated embodiment, a UBM 82 is physically and electrically coupled to underlying redistribution lines 66 that are routed adjacent to one another. In another embodiment, a UBM 82 is physically and electrically coupled to underlying redistribution lines 66 that are not routed adjacent to one another. For example, the UBM 82 may be physically and electrically coupled to first redistribution lines 66, and the first redistribution lines 66 may be separated from one another by a second redistribution line 66, with the UBM 82 not being physically and electrically coupled to the second redistribution line 66.

Optionally, solder regions (e.g., solder balls or solder bumps) may be disposed on the UBMs 82. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing (e.g., are packaged), and devices, which fail the CP testing, do not undergo subsequent processing (e.g., are not packaged) in some embodiments. After testing, the solder regions may be removed.

Figure 7:
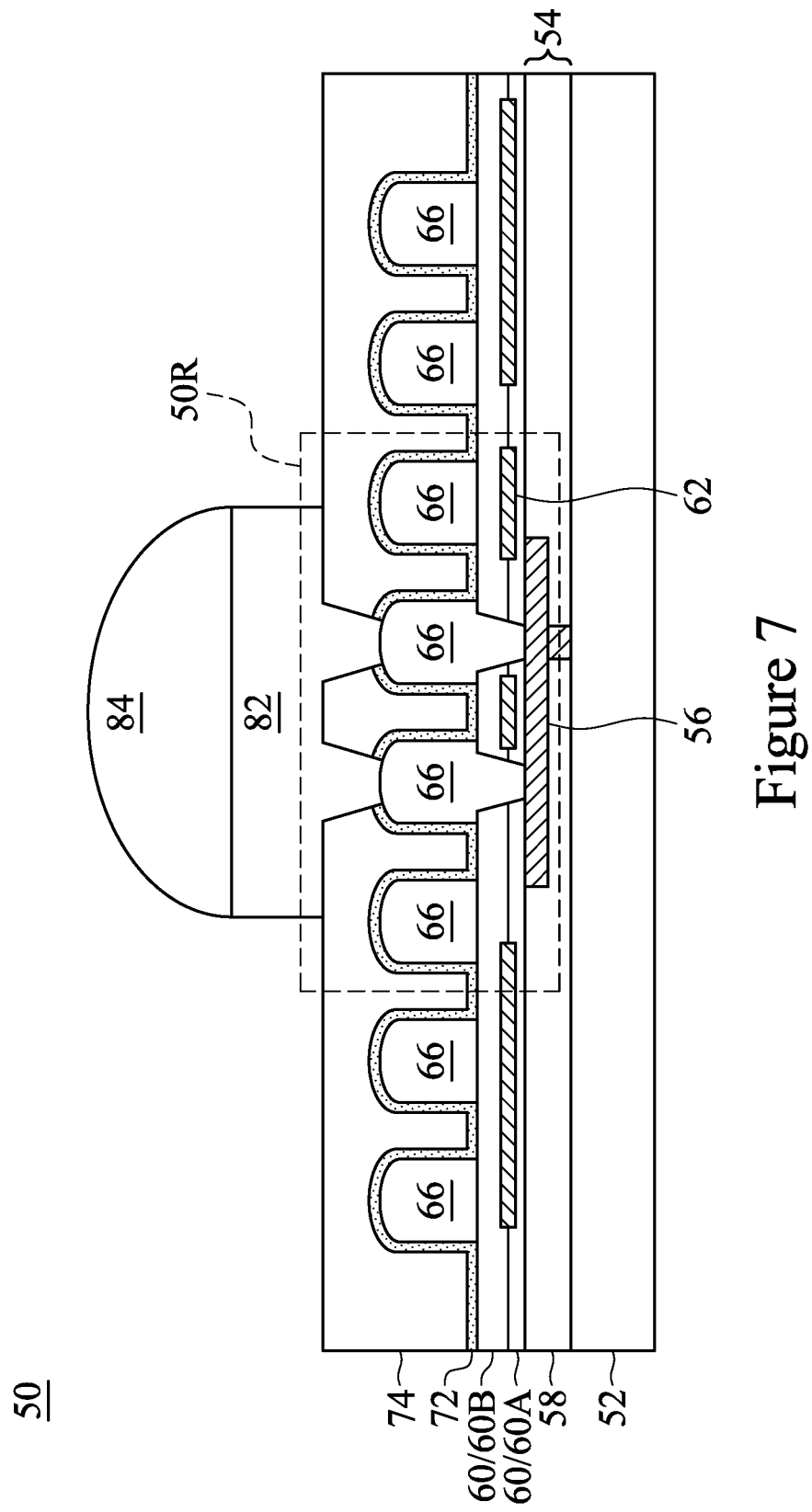

In FIG. 7, conductive connectors 84 are formed on the UBMs 82. The conductive connectors 84 may be ball grid array (BGA) connectors, solder balls, or the like. The conductive connectors 84 may include a conductive material such as solder, copper, aluminum, gold, nickel, silver, palladium, tin, the like, or a combination thereof. In some embodiments, the conductive connectors 84 are formed by initially forming a layer of solder material on the UBMs 82 through evaporation, electroplating, printing, solder transfer, ball placement, or the like. Once a layer of solder material has been formed on the UBMs 82, a reflow may be performed in order to shape the solder material into desired bump shapes.

Additional processing may be performed to complete formation of the integrated circuit die 50. For example, when the integrated circuit die 50 is formed in a wafer that includes different device regions, the device regions may be singulated to form a plurality of integrated circuit dies 50. The singulation process may include sawing along scribe line regions, e.g., between the device regions of the wafer. The sawing singulates device regions of the wafer from one another, and the resulting integrated circuit die 50 is from one of the device regions.

Referring to FIGS. 8A through 11, additional features of the integrated circuit die 50 are described. FIGS. 8A, 8B, 9A, 9B, 10A, and 10B are top-down views of integrated circuit dies 50, in accordance with various embodiments. FIG. 11 is a detailed view of a region 50R from FIG. 7, showing additional details of the integrated circuit die 50, in accordance with some embodiments. Some features of the integrated circuit dies 50 are omitted from these figures for illustration clarity. As noted above, the UBMs 82 may be one of several types of bumps. In some embodiments, the UBMs 82 are micro bumps. In some embodiments, the UBMs 82 are C4 bumps. Integrated circuit dies 50 may have different features depending whether the UBMs 82 are micro bumps or C4 bumps.

The trace portions 66T of the redistribution lines 66 extend lengthwise along the top surface of the passivation layer(s) 60, such as in the Y-direction. The trace portions 66T of the redistribution lines 66 have a width $W_1$ in the X-direction and a length in the Y-direction, with the length being greater than the width $W_1$. When the UBMs 82 are micro bumps, the width $W_1$ can be in the range of about 1.5 µm to about 10 µm. When the UBMs 82 are C4 bumps, the width $W_1$ can be in the range of about 5 µm to about 45 µm. The trace portions 66T of the redistribution lines 66 have a height $H_1$ in the Z-direction. When the UBMs 82 are micro bumps, the height $H_1$ can be in the range of about 3 µm to about 6 µm. When the UBMs 82 are C4 bumps, the height $H_1$ can be in the range of about 3 µm to about 6 µm.

The via portions 66V of the redistribution lines 66 can have the same width $W_2$ in the X-direction and the Y-direction, or can have different widths $W_2$ in the X-direction and the Y-direction. When the UBMs 82 are micro bumps, the width $W_2$ in the X-direction can be in the range of about 1 m to about 2.7 µm, and the width $W_2$ in the Y-direction can be in the range of about 1 µm to about 4.5 µm. When the UBMs 82 are C4 bumps, the width $W_2$ in the X-direction can be in the range of about 1.8 µm to about 2.7 µm, and the width $W_2$ in the Y-direction can be in the range of about 1.8 µm to about 4.5 µm. In some embodiments, different redistribution lines 66 of a same integrated circuit die 50 have via portions 66V of different widths $W_2$.

The trace portions 66T of the redistribution lines 66 are spaced apart by a spacing distance $S_1$ in the X-direction, and the via portions 66V of the redistribution lines 66 are spaced apart by a spacing distance $S_2$ in the X-direction. The spacing distance $S_1$ can be greater than or equal to the width $W_1$, and the spacing distance $S_2$ can be greater than or equal to the width $W_2$. When the UBMs 82 are micro bumps, the spacing distance $S_1$ can be in the range of about 0.2 µm to about 5 µm and the spacing distance $S_2$ can be in the range of about 2 µm to about 6 µm. When the UBMs 82 are C4 bumps, the spacing distance $S_1$ can be in the range of about 0.5 µm to about 15 µm and the spacing distance $S_2$ can be in the range of about 2 µm to about 20 m. The trace portions 66T of the redistribution lines 66 can have a feature density in the range of about 55% to about 85%.

Figure 8A:
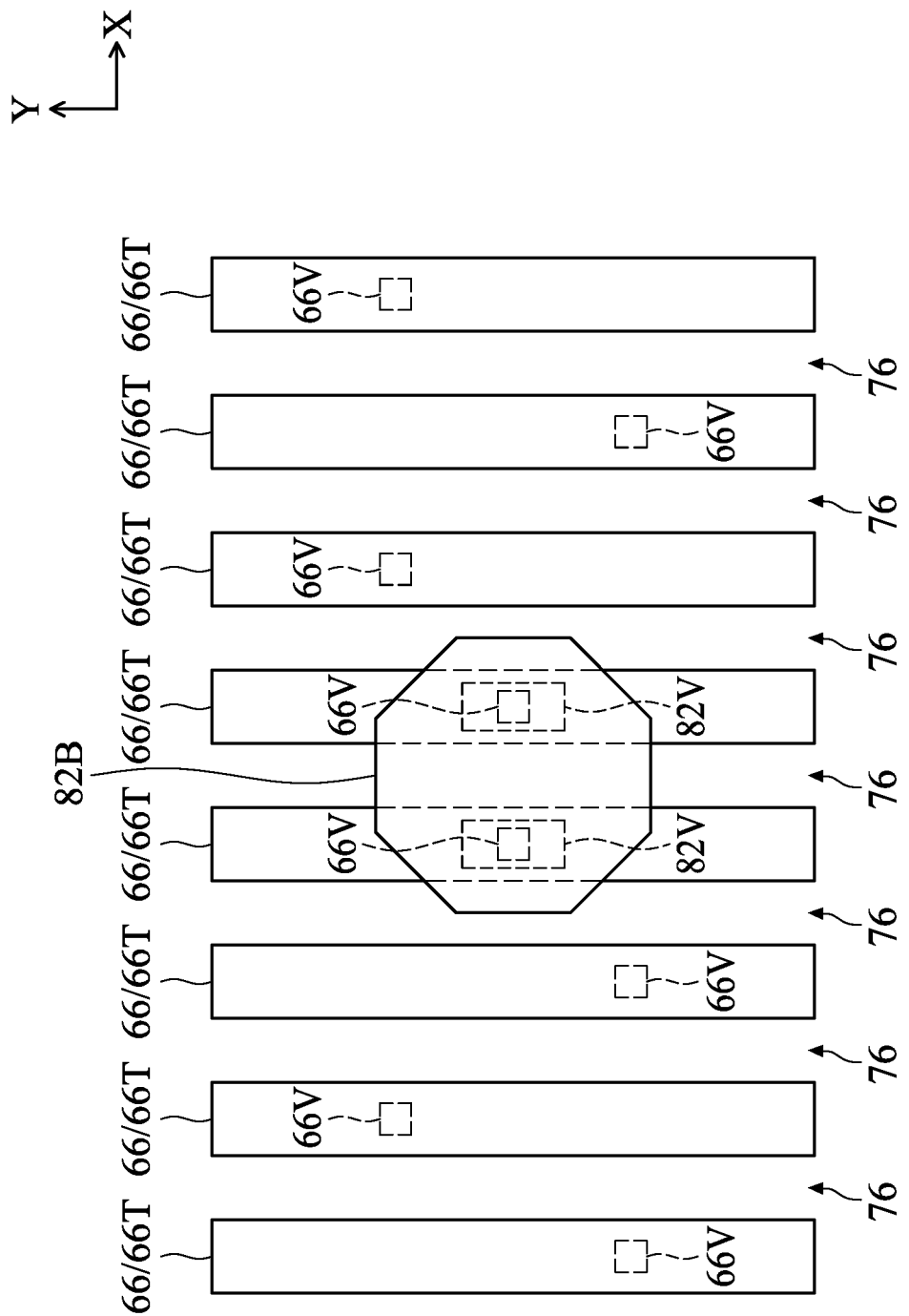
FIGS. 8A, 8B, 9A, 9B, 10A, and 10B are top-down views of integrated circuit dies, in accordance with various embodiments.
Figure 8B:
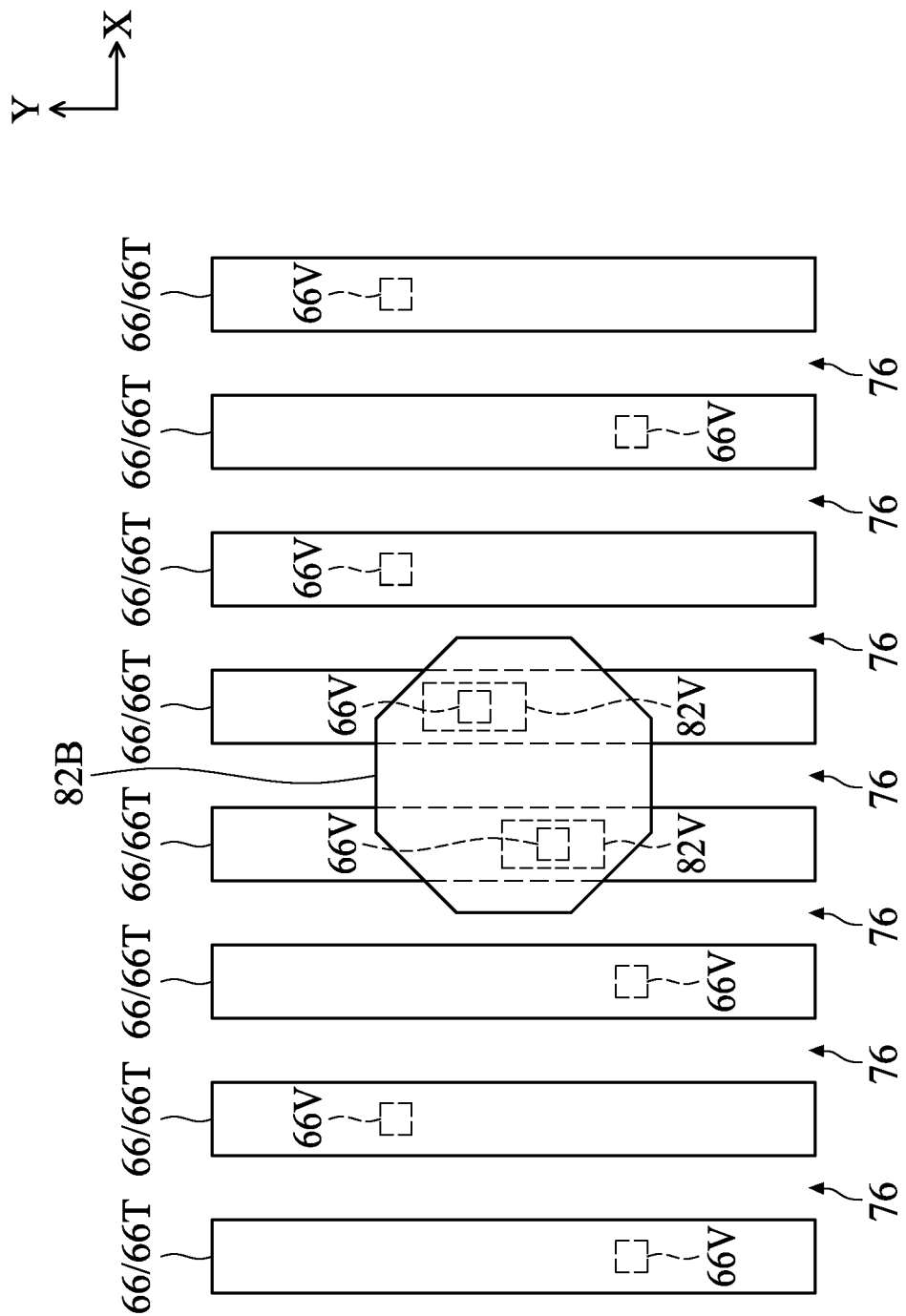
Figure 9A:
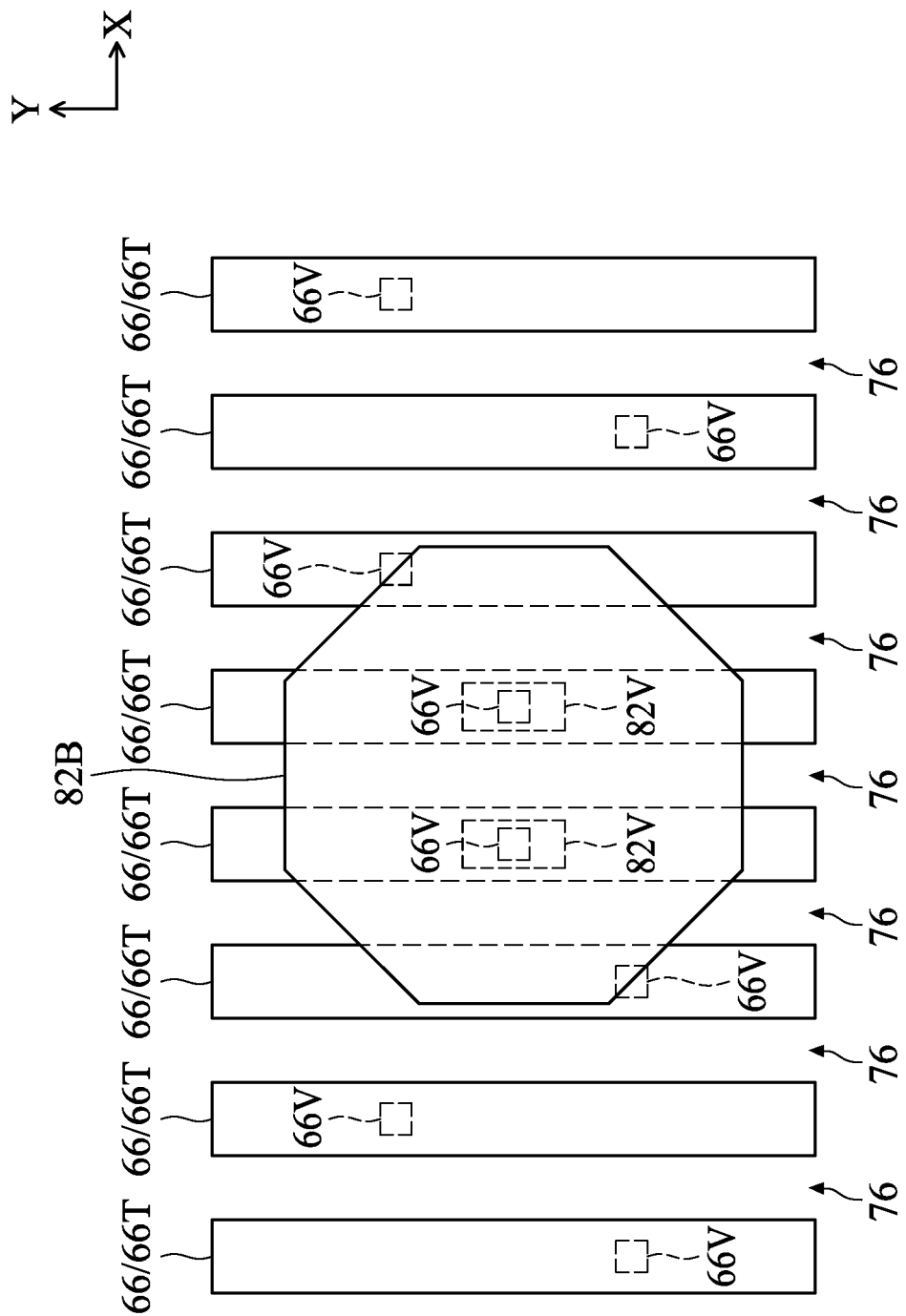
Figure 9B:
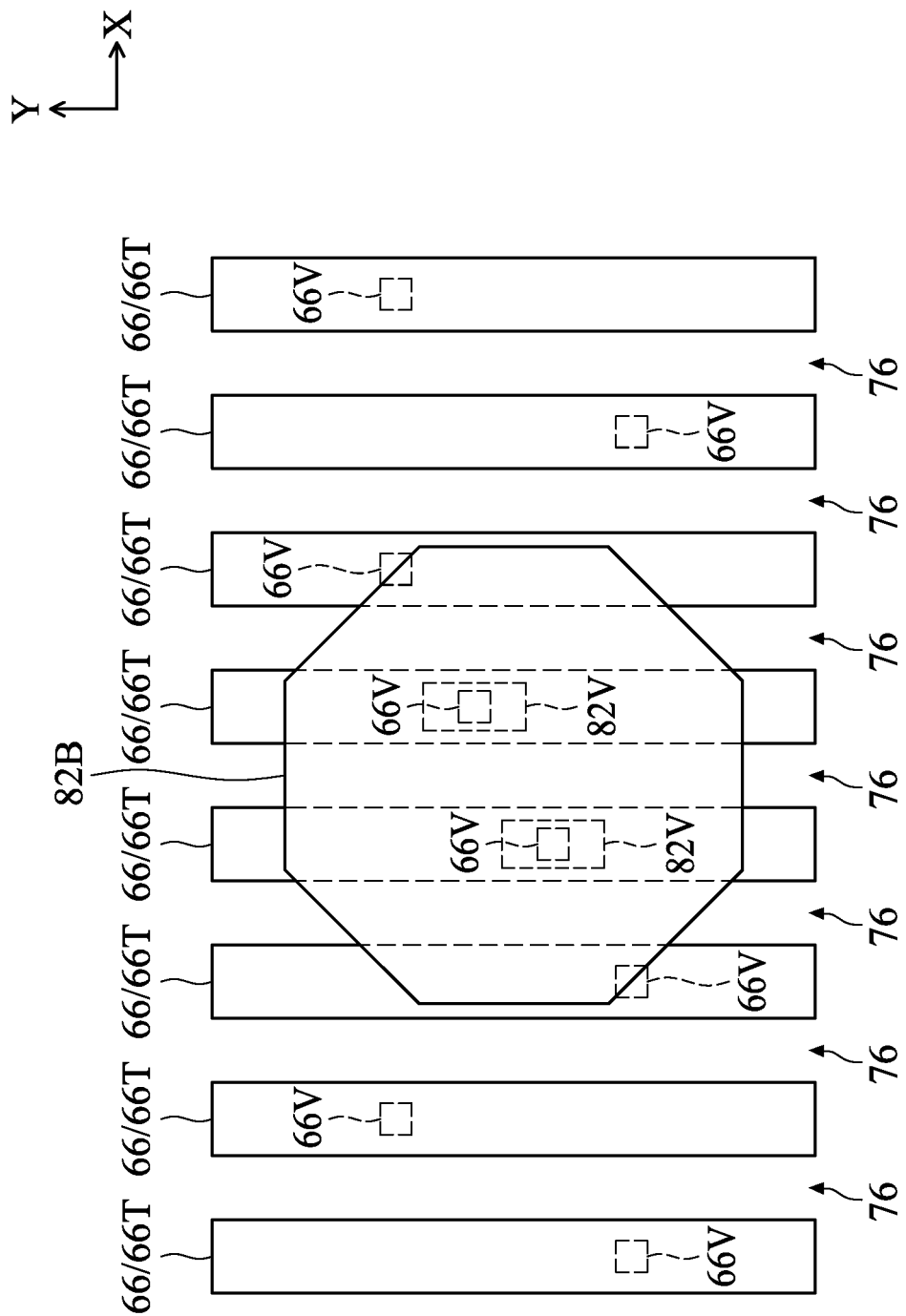
Figure 10A:
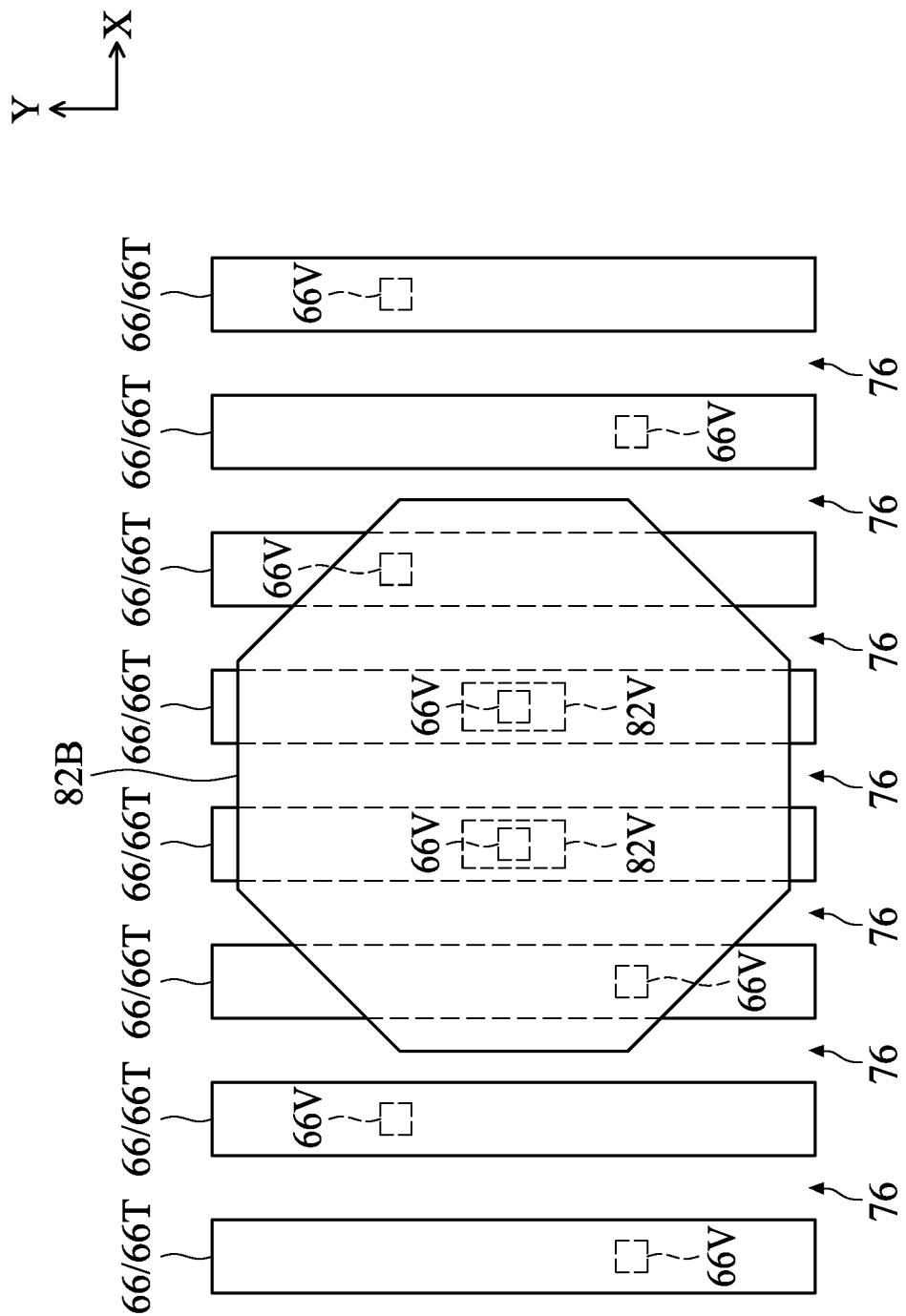
Figure 10B:
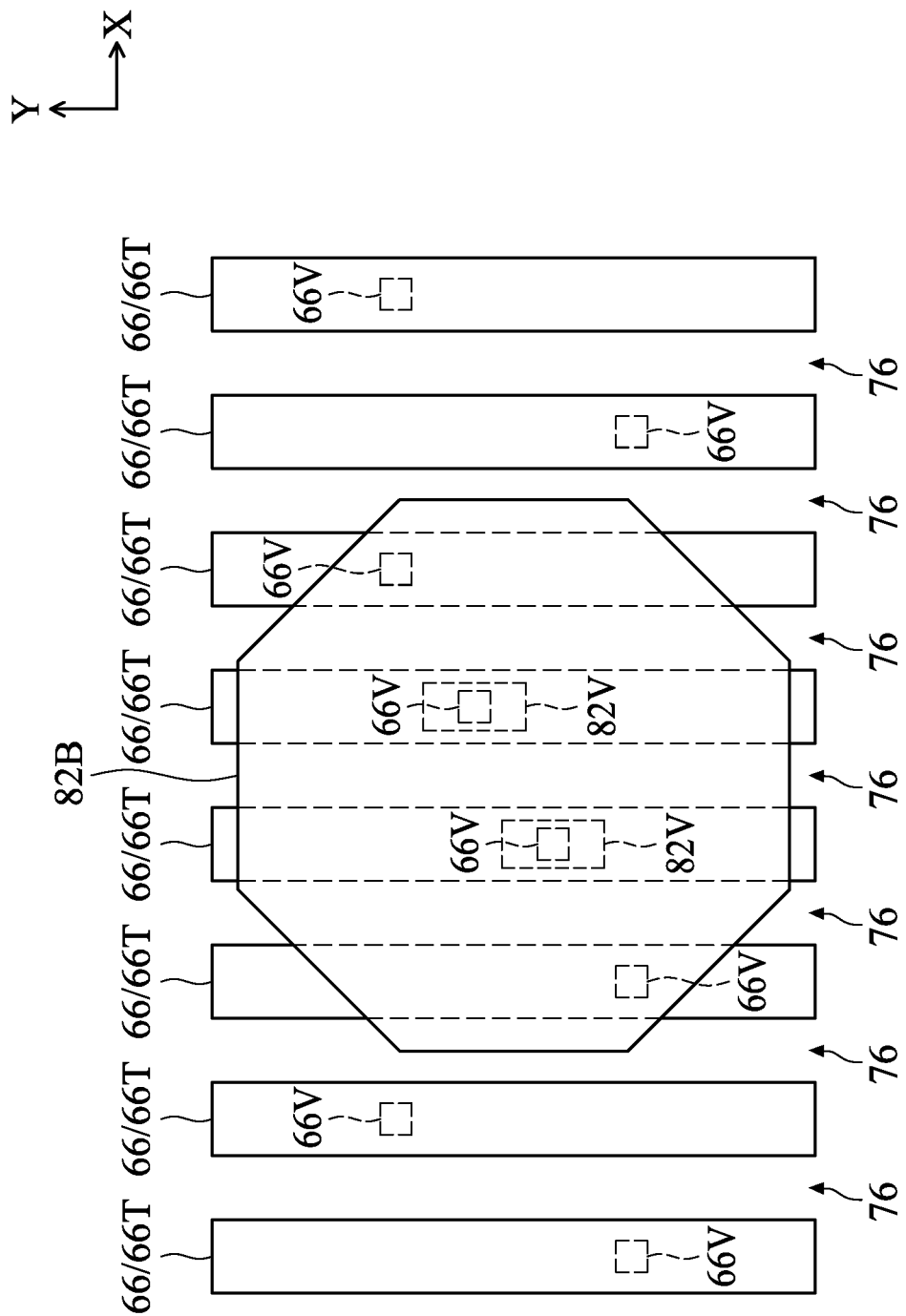

The UBMs 82 are formed to a large size, such that they overlap a plurality of the redistribution lines 66. The UBMs 82 overlap the redistribution lines 66 in a direction (e.g., the X-direction) that is perpendicular to the lengthwise direction of the redistribution lines 66 (e.g., the Y-direction). The UBMs 82 have a width $W_3$ in the X-direction, which is greater than the sum of the width $W_1$ of each underlying redistribution line 66 and the spacing distance $S_1$ between each underlying redistribution line 66. When the UBMs 82 are micro bumps, the width $W_3$ can be in the range of about 5 µm to about 22 µm. When the UBMs 82 are C4 bumps, the width $W_3$ can be in the range of about 20 µm to about 90 µm. Forming the UBMs 82 to a large size allows for a greater contact area (which may reduce contact resistance) and allows for greater flexibility in the routing of the redistribution lines 66. In various embodiments, the UBMs 82 may only overlap the redistribution lines 66 to which they are coupled (as shown by FIGS. 8A and 8B); the UBMs 82 may overlap the redistribution lines 66 to which they are coupled and only partially overlap adjacent redistribution lines 66 (as shown by FIGS. 9A and 9B); or the UBMs 82 may overlap the redistribution lines 66 to which they are coupled and fully overlap adjacent redistribution lines 66 (as shown by FIGS. 10A and 10B). Further, the UBMs 82 may only overlap the via portions 66V of the redistribution lines 66 to which they are coupled (as shown by FIGS. 8A and 8B); the UBMs 82 may overlap the via portions 66V of the redistribution lines 66 to which they are coupled and may only partially overlap the via portions 66V of adjacent redistribution lines 66 (as shown by FIGS. 9A and 9B); or the UBMs 82 may overlap the via portions 66V of the redistribution lines 66 to which they are coupled and may fully overlap the via portions 66V of adjacent redistribution lines 66 (as shown by FIGS. 10A and 10B).

As noted above, some redistribution lines 66 are functional redistribution lines 66F and some redistribution lines 66 are dummy redistribution lines 66D. A UBM 82 is coupled to one or more functional redistribution lines 66F, and thus overlaps at least those redistribution lines 66. When the UBM 82 overlaps but is not coupled to adjacent redistribution lines 66, those adjacent redistribution lines 66 may be functional redistribution lines 66F (which are coupled to other UBMs 82) or may be dummy redistribution lines 66D (which are not coupled to other UBMs 82). Forming a UBM 82 to overlap dummy redistribution lines 66D may provide mechanical support for the UBM 82 when no functional redistribution lines 66F are available for placement beneath the UBM 82.

Each via portion 82V of a UBM 82 is disposed directly over a via portion 66V of the corresponding underlying redistribution line 66, such that the centers of each corresponding pair of via portions 66V, 82V are laterally aligned with one another along the X-direction and the Y-direction. The strength of the connections between layers may thus be increased. Various features may be aligned along the Y-direction or may be disposed at different locations along the Y-direction. In various embodiments, the via portions 66V, 82V are laterally aligned with the center of their corresponding bump portion 82B along the Y-direction (as shown by FIGS. 8A, 9A, and 10A); or the via portions 66V, 82V are laterally offset from the center of their corresponding bump portion 82B along the Y-direction (as shown by FIGS. 8B, 9B, and 10B). When the UBMs 82 are micro bumps, the via portions 66V, 82V may be laterally aligned with or laterally offset from the center of their corresponding bump portion 82B along the Y-direction. When the UBMs 82 are C4 bumps, via portions 66V, 82V are laterally offset from the center of their corresponding bump portion 82B along the Y-direction, and are not laterally aligned with the center of their corresponding bump portion 82B along the Y-direction.

Although a single UBM 82 and a single conductive connector 84 are illustrated, it should be appreciated that a plurality of UBMs 82 and a plurality of conductive connectors 84 are formed. The UBMs 82 can have a uniform pitch, or can have diverse pitches. When the UBMs 82 are micro bumps, they can have a uniform or diverse pitches, with the pitch(es) being in the range of about 10 µm to about 50 µm. When the UBMs 82 are C4 bumps, they can have a uniform pitch, with the pitch being in the range of about 40 µm to about 140 µm.

The via portions 82V of the UBMs 82 have upper widths $W_4$ (corresponding to the target widths of the openings 78, see FIG. 5), and lower width $W_5$ (also referred to as the critical dimensions of the via portions 82V). The upper widths $W_4$ may be greater than the lower width $W_5$, particularly in embodiments where the dielectric layer 74 is formed. The via portions 82V have different widths $W_4$, $W_5$ in the X-direction and the Y-direction. Specifically, the widths $W_4$, $W_5$ in the X-direction are less than the widths $W_4$, $W_5$ in the Y-direction. When the UBMs 82 are micro bumps, the widths $W_4$, $W_5$ in the X-direction can be in the range of about 0 μm to about 22 μm, and the widths $W_4$, $W_5$ in the Y-direction can be in the range of about 0 μm to about 36 μm. When the UBMs 82 are C4 bumps, the width $W_4$ in the X-direction can be in the range of about 8 μm to about 78 μm, the widths $W_4$ in the Y-direction can be in the range of about 20 μm to about 40 μm, the width $W_5$ in the X-direction can be in the range of about 6 μm to about 79 μm, and the width $W_5$ in the Y-direction can be in the range of about 6 μm to about 79 μm.

The via portions 82V of the UBMs 82 have a height $H_2$ in the Z-direction. The height $H_2$ depends on which of the dielectric layers 72, 74 are formed, but at least is greater than or equal to the thickness $T_1$ and is less than the thickness $T_2$. When the UBMs 82 are micro bumps, the height $H_2$ can be in the range of about 2 μm to about 15 μm. When the UBMs 82 are C4 bumps, the height $H_2$ can be in the range of about 2 μm to about 15 μm.

The bump portions 82B of the UBMs 82 may have substantially vertical sidewalls, while the via portions 82V of the UBMs 82 may have slanted sidewalls. The sidewalls of each via portion 82V form an angle $θ_1$ with the top surface of the dielectric layer 74, and form an angle $θ_2$ with the top surface of the underlying redistribution line 66. The angle $θ_1$ is greater than the angle $θ_2$. When the UBMs 82 are micro bumps, the angle $θ_1$ can be in the range of about 10 degrees to about 180 degrees, and the angle $θ_2$ can be in the range of about 10 degrees to about 90 degrees. When the UBMs 82 are C4 bumps, the angle $θ_1$ can be in the range of about 10 degrees to about 180 degrees, and the angle $θ_2$ can be in the range of about 10 degrees to about 90 degrees.

In the illustrated embodiments, the bump portions 82B of the UBMs 82 have octagonal shapes in the top-down views. The bump portions 82B of the UBMs 82 may have other shapes in the top-down views, such as rounded shapes (e.g., circular shapes, oval shapes, etc.) or other polygon shapes (e.g., hexagon shapes, quadrilateral shapes, etc.)

Figure 12:
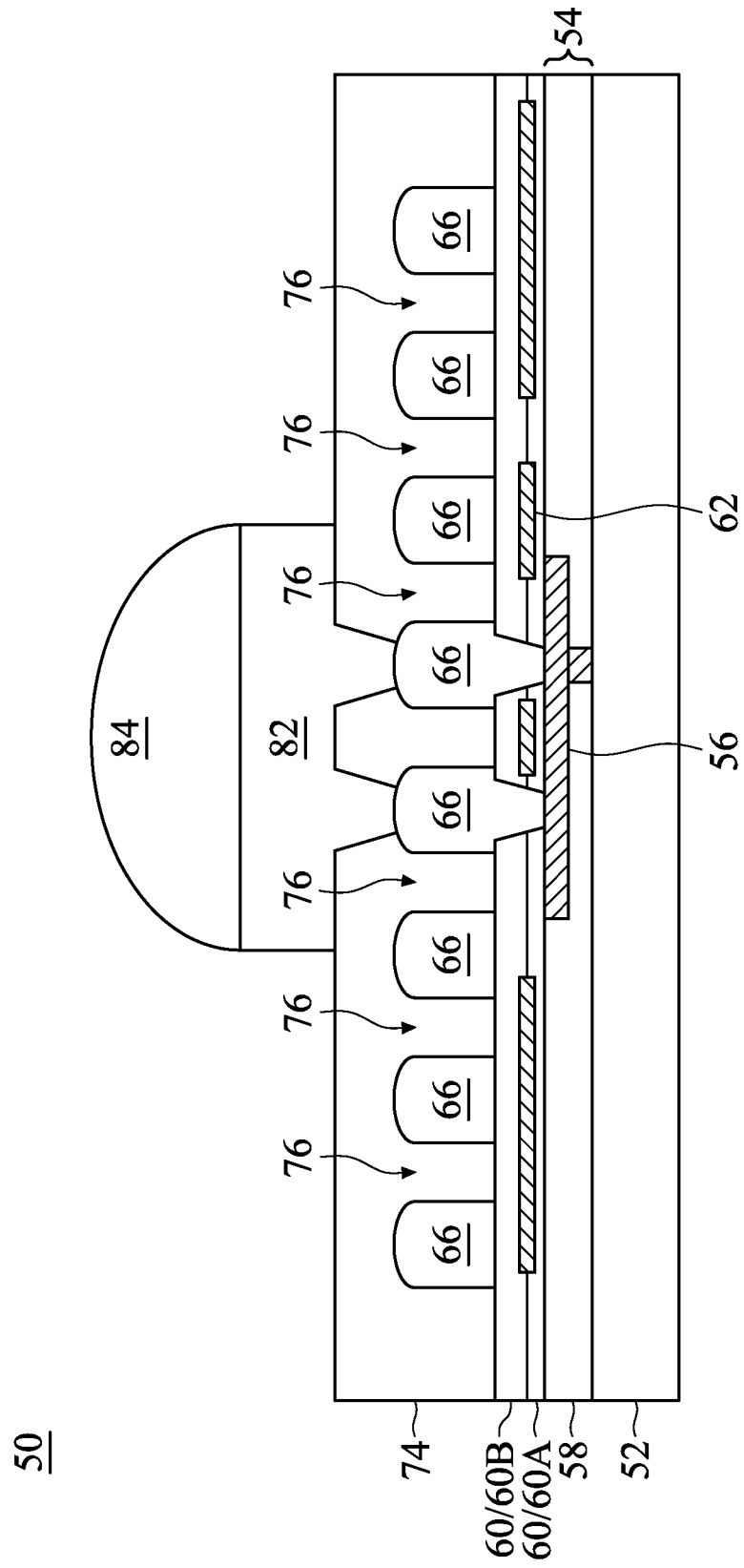
FIG. 12 is a cross-sectional view of an integrated circuit die, in accordance with some embodiments.

FIG. 12 is a cross-sectional view of an integrated circuit die 50, in accordance with some embodiments. This embodiment is similar to the embodiment of FIG. 7, except the dielectric layer 74 is formed and the dielectric layer 72 is omitted. The manufacturing complexity of the integrated circuit die 50 may thus be reduced. Omitting the dielectric layer 72 may be possible when the dielectric layer 74 is formed by a process that has good gap-filling properties. For example, the dielectric layer 74 may be formed of an oxide or a nitride by CVD. As a result, the areas (e.g., gaps 76) between the redistribution lines 66 may still be substantially filled, even when the dielectric layer 72 is omitted. The integrated circuit die 50 may have any of the features previously described for FIGS. 8A through 11.

Figure 13:
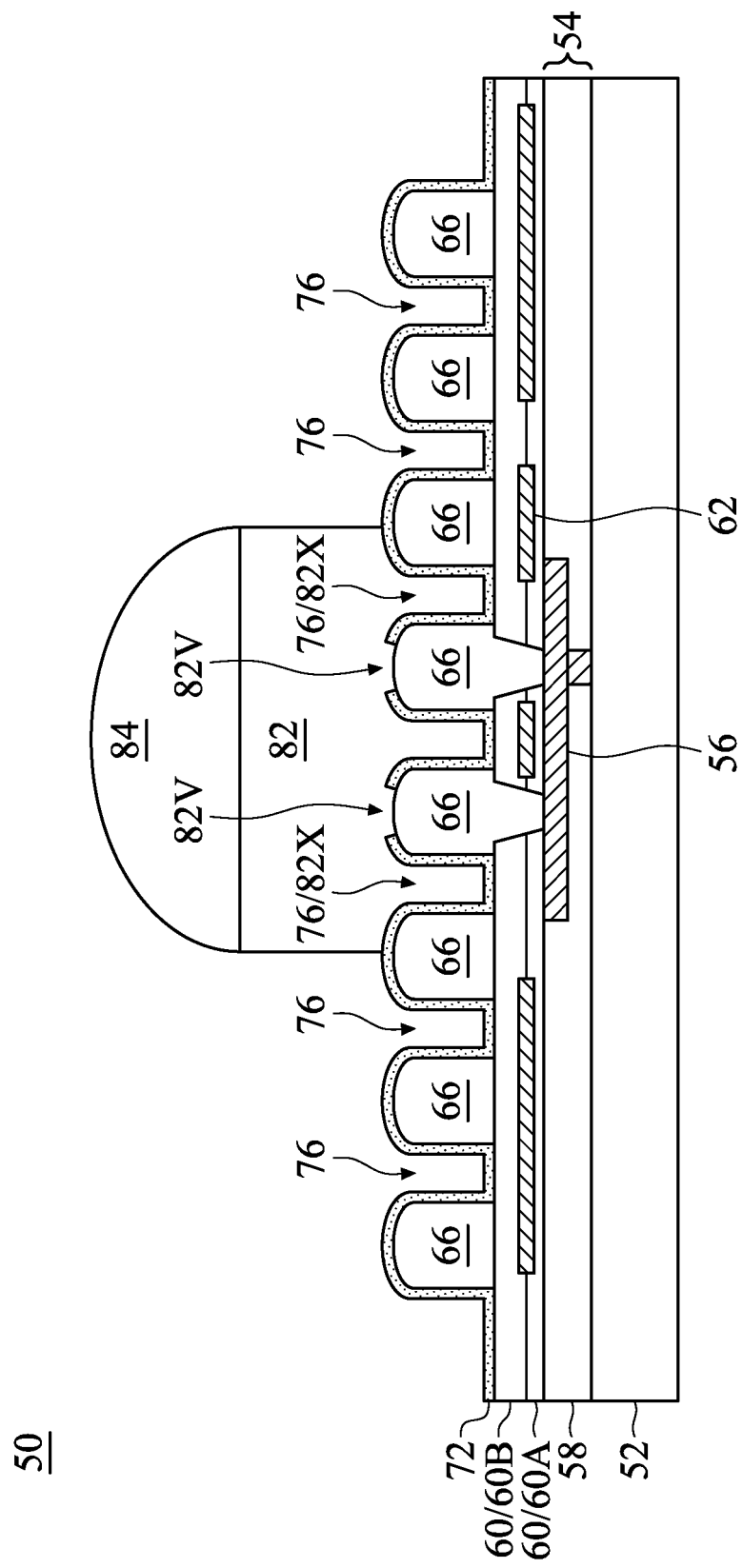
FIG. 13 is a cross-sectional view of an integrated circuit die, in accordance with some embodiments.

FIG. 13 is a cross-sectional view of an integrated circuit die 50, in accordance with some embodiments. This embodiment is similar to the embodiment of FIG. 7, except the dielectric layer 72 is formed and the dielectric layer 74 is omitted. The manufacturing complexity of the integrated circuit die 50 may thus be reduced. Omitting the dielectric layer 74 allows the UBMs 82 to also be formed with extension portions 82X in a subset of the areas (e.g., gaps 76) between the redistribution lines 66. The bottom surfaces of the extension portions 82X are disposed closer to the semiconductor substrate 52 than the bottom surfaces of the via portions 82V. By forming the extension portions 82X, the UBMs 82 may interface with more surfaces in different planes, decreasing the risk of the UBMs 82 delaminating. The reliability of the integrated circuit die 50 may thus be increased. Further, the areas (e.g., gaps 76) between the redistribution lines 66 may still be substantially filled (e.g., by the extension portions 82X), even when the dielectric layer 74 is omitted. The integrated circuit die 50 may have any of the features previously described for FIGS. 8A through 11.

Figure 14:
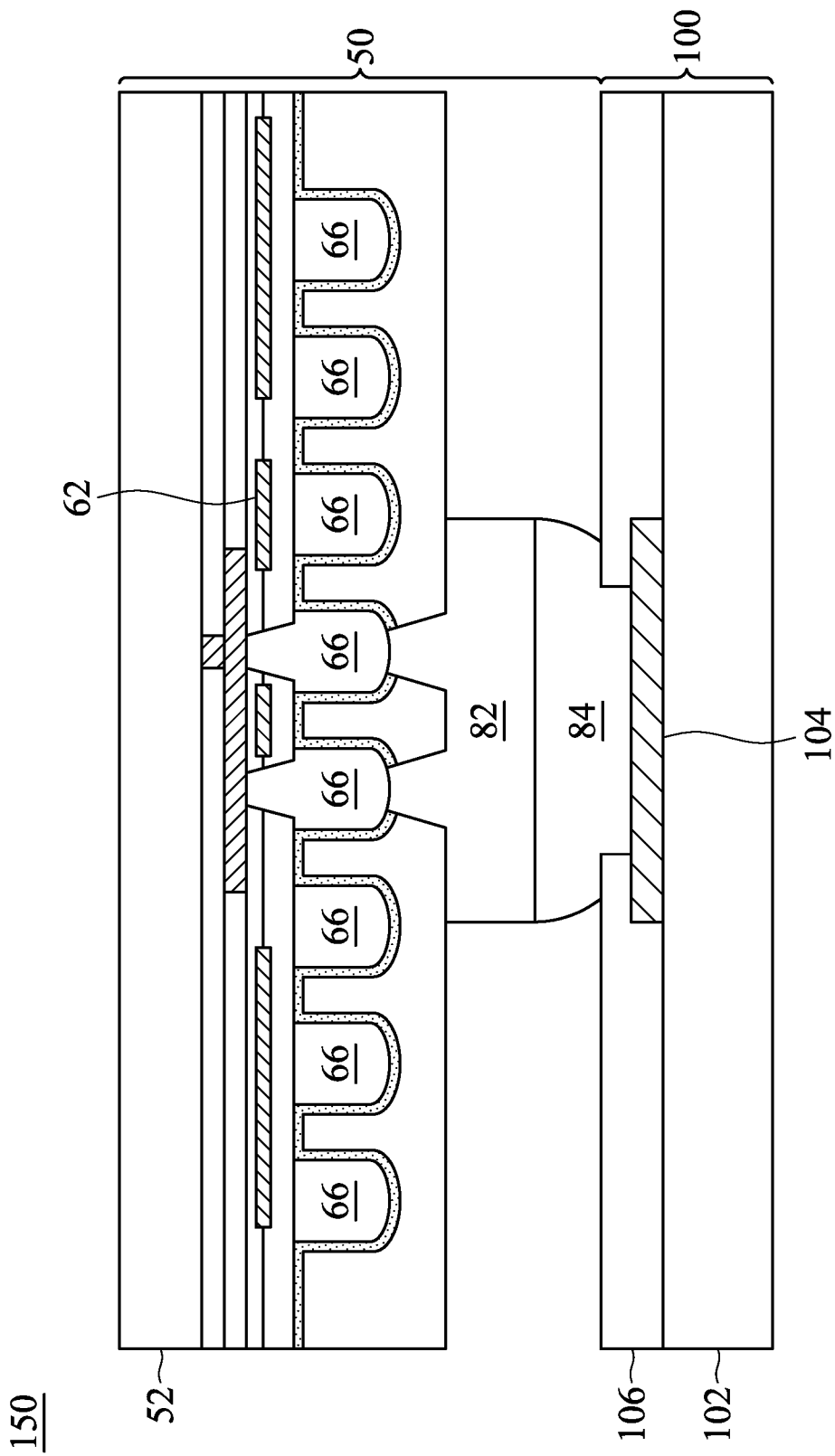
FIG. 14 is a cross-sectional view of an integrated circuit package, in accordance with some embodiments.

FIG. 14 is a cross-sectional view of an integrated circuit package 150, in accordance with some embodiments. The integrated circuit package 150 is formed by bonding an integrated circuit die 50 to a package substrate 100. The bonding process may be, e.g., a flip-chip bonding process. The integrated circuit package 150 is illustrated for the integrated circuit die 50 of FIG. 7, but it should be appreciated that any of the integrated circuit dies 50 described herein may be packaged to form the integrated circuit package 150.

After the integrated circuit die 50 is formed, it is flipped and attached to a package substrate 100 using the conductive connectors 84. The package substrate 100 may be an interposer, a printed circuit board (PCB), or the like. The package substrate 100 includes a substrate core 102 and bond pads 104 over the substrate core 102. The substrate core 102 may be formed of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 102 may be a SOI substrate. Generally, an SOI substrate includes a layer of a semiconductor material such as epitaxial silicon, germanium, silicon germanium, SOI, SGOI, or combinations thereof. The substrate core 102 is, in one alternative embodiment, based on an insulating core such as a fiberglass reinforced resin core. One example core material is fiberglass resin such as FR4. Alternatives for the core material include bismaleimide-triazine (BT) resin, or alternatively, other PCB materials or films. Build up films such as Ajinomoto Build-up Film (ABF) or other laminates may be used for substrate core 102.

The substrate core 102 may include active and/or passive devices (not separately illustrated). A wide variety of devices such as transistors, capacitors, resistors, combinations of these, and the like may be used to generate the structural and functional designs for the device stack. The devices may be formed using any suitable methods.

The substrate core 102 may also include metallization layers and vias (not separately illustrated), with the bond pads 104 being physically and/or electrically coupled to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate core 102 is substantially free of active and passive devices.

In some embodiments, the conductive connectors 84 are reflowed to attach the integrated circuit die 50 to the bond pads 104. The conductive connectors 84 electrically and/or physically couple the package substrate 100, including metallization layers in the substrate core 102, to the integrated circuit die 50. In some embodiments, a solder resist 106 is formed on the substrate core 102. The conductive connectors 84 may be disposed in openings in the solder resist 106 to be electrically and mechanically coupled to the bond pads 104. The solder resist 106 may be used to protect areas of the package substrate 100 from external damage.

The conductive connectors 84 may have an epoxy flux (not separately illustrated) formed thereon before they are reflowed with at least some of the epoxy portion of the epoxy flux remaining after the integrated circuit die 50 is attached to the package substrate 100. This remaining epoxy portion may act as an underfill to reduce stress and protect the joints resulting from the reflowing the conductive connectors 84. In some embodiments, an underfill (not separately illustrated) may be formed between the integrated circuit die 50 and the package substrate 100, surrounding the conductive connectors 84. The underfill may be formed by a capillary flow process after the integrated circuit die 50 is attached or may be formed by a suitable deposition method before the integrated circuit die 50 is attached.

In some embodiments, passive devices (e.g., surface mount devices (SMDs), not separately illustrated) may also be attached to the integrated circuit die 50 (e.g., to the UBMs 82) or to the package substrate 100 (e.g., to the bond pads 104). For example, the passive devices may be bonded to a same surface of the integrated circuit die 50 or the package substrate 100 as the conductive connectors 84. The passive devices may be attached to the integrated circuit die 50 prior to mounting the integrated circuit die 50 to the package substrate 100, or may be attached to the package substrate 100 prior to or after mounting the integrated circuit die 50 to the package substrate 100.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. As noted above, the UBMs 82 are formed to a large width such that they overlap multiple underlying redistribution lines 66, possibly including underlying redistribution lines 66 to which the UBMs 82 are not coupled (e.g., dummy redistribution lines 66D or other functional redistribution lines 66F). Forming the UBMs 82 to a large size allows for a greater contact area (which may reduce contact resistance) and allows for greater flexibility in the routing of the redistribution lines 66. Further, in some embodiments, the UBMs 82 are formed with extension portions 82X in areas between the underlying redistribution lines 66. By forming the extension portions 82X, the UBMs 82 may interface with more surfaces in different planes, decreasing the risk of the UBMs 82 delaminating. The reliability of the integrated circuit die 50 may thus be increased.

In an embodiment, a device includes: a passivation layer on a semiconductor substrate; a first redistribution line on and extending along the passivation layer; a second redistribution line on and extending along the passivation layer; a first dielectric layer on the first redistribution line, the second redistribution line, and the passivation layer; and an under bump metallization having a bump portion and a first via portion, the bump portion disposed on and extending along the first dielectric layer, the bump portion overlapping the first redistribution line and the second redistribution line, the first via portion extending through the first dielectric layer to be physically and electrically coupled to the first redistribution line. In some embodiments of the device, the first redistribution line and the second redistribution line extend lengthwise along the passivation layer in a first direction, and the bump portion fully overlaps the first redistribution line and partially overlaps the second redistribution line in a second direction, the second direction perpendicular to the first direction. In some embodiments of the device, the first redistribution line and the second redistribution line extend lengthwise along the passivation layer in a first direction, and the bump portion fully overlaps the first redistribution line and fully overlaps the second redistribution line in a second direction, the second direction perpendicular to the first direction. In some embodiments of the device, the second redistribution line is a functional redistribution line, and the first dielectric layer is disposed between the under bump metallization and the functional redistribution line. In some embodiments of the device, the second redistribution line is a dummy redistribution line, and the first dielectric layer is disposed between the under bump metallization and the dummy redistribution line. In some embodiments of the device, the under bump metallization has a second via portion, the second via portion extending through the first dielectric layer to be physically and electrically coupled to the second redistribution line. In some embodiments of the device, the first redistribution line has a trace portion and a second via portion, the trace portion disposed on and extending along the passivation layer, the second via portion extending through the passivation layer, a center of the first via portion laterally aligned with a center of the second via portion. In some embodiments of the device, a center of the bump portion is laterally aligned with the center of the first via portion and the center of the second via portion. In some embodiments of the device, a center of the bump portion is laterally offset from the center of the first via portion and the center of the second via portion.

In an embodiment, a device includes: a first passivation layer on a semiconductor substrate; a first redistribution line on and extending along the first passivation layer, the first redistribution line having a first width; a second redistribution line on and extending along the first passivation layer, the second redistribution line having a second width, the second redistribution line separated from the first redistribution line by a first distance; a first dielectric layer on the first redistribution line, the second redistribution line, and the first passivation layer; and an under bump metallization on the first dielectric layer, the under bump metallization coupled to the first redistribution line and the second redistribution line, the under bump metallization having a third width, the third width being greater than the sum of the first width, the second width, and the first distance. In some embodiments, the device further includes: a second passivation layer between the first passivation layer and the semiconductor substrate; and a passive device between the second passivation layer and the first passivation layer. In some embodiments of the device, the first dielectric layer includes an oxide or a nitride, and the device further includes: a second dielectric layer between the first dielectric layer and the under bump metallization, the second dielectric layer including a polyimide, the first dielectric layer and the second dielectric layer filling an area between the first redistribution line and the second redistribution line. In some embodiments of the device, the first dielectric layer includes a polyimide, and the device further includes: a second dielectric layer between the first dielectric layer and the first passivation layer, the second dielectric layer including an oxide or a nitride, the first dielectric layer and the second dielectric layer filling an area between the first redistribution line and the second redistribution line. In some embodiments of the device, the under bump metallization has a bump portion and an extension portion, the bump portion disposed on the first dielectric layer, the extension portion disposed between the first redistribution line and the second redistribution line, the first dielectric layer and the extension portion filling an area between the first redistribution line and the second redistribution line. In some embodiments, the device further includes: a package substrate; and a conductive connector bonding the package substrate to the under bump metallization.

In an embodiment, a method includes: depositing a first passivation layer on a semiconductor substrate; forming a first redistribution line and a second redistribution line on and extending along the first passivation layer; forming a first dielectric layer on the first redistribution line and the second redistribution line; patterning a first opening and a second opening in the first dielectric layer, the first opening exposing the first redistribution line, the second opening exposing the second redistribution line; and forming an under bump metallization in the first opening and the second opening, the under bump metallization overlapping the first redistribution line and the second redistribution line. In some embodiments of the method, forming the first redistribution line and the second redistribution line includes: patterning a third opening and a fourth opening in the first passivation layer; and plating the first redistribution line in the third opening and the second redistribution line in the fourth opening, where a center of the first opening is laterally aligned with a center of the third opening, and where a center of the second opening is laterally aligned with a center of the fourth opening. In some embodiments of the method, the under bump metallization is further plated in an area between the first redistribution line and the second redistribution line. In some embodiments, the method further includes: forming a second dielectric layer on the first dielectric layer, the under bump metallization plated on the second dielectric layer, the first opening and the second opening further patterned in the second dielectric layer, where forming the first dielectric layer includes depositing an oxide or a nitride, and where forming the second dielectric layer includes spinning on a polyimide. In some embodiments, the method further includes: forming a second dielectric layer on the first passivation layer, the first dielectric layer formed on the second dielectric layer, the first opening and the second opening further patterned in the second dielectric layer, where forming the first dielectric layer includes spinning on a polyimide, where forming the second dielectric layer includes depositing an oxide or a nitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
  a passivation layer over a semiconductor substrate;
  a first redistribution line having a first trace portion disposed over and extending along the passivation layer;
  a second redistribution line having a second trace portion disposed over and extending along the passivation layer;
  a dielectric layer over the first redistribution line, the second redistribution line, and the passivation layer; and
  an under bump metallization having a bump portion, a first via portion, and a second via portion, the bump portion disposed over and extending along the dielectric layer, the bump portion overlapping the first redistribution line and the second redistribution line, the first via portion extending through the dielectric layer to be physically and electrically coupled to the first redistribution line, the second via portion extending through the dielectric layer to be physically and electrically coupled to the second redistribution line,
  wherein the first redistribution line has a third via portion extending through the passivation layer, the second redistribution line has a fourth via portion extending through the passivation layer, a center of the first via portion is laterally aligned with a center of the third via portion, and a center of the second via portion is laterally aligned with a center of the fourth via portion.

2. The device of claim 1, wherein the first trace portion and the second trace portion extend lengthwise along the passivation layer in a first direction, and the bump portion fully overlaps the first redistribution line and partially overlaps the second redistribution line in a second direction, the second direction perpendicular to the first direction.

3. The device of claim 1, wherein the first trace portion and the second trace portion extend lengthwise along the passivation layer in a first direction, and the bump portion fully overlaps the first redistribution line and fully overlaps the second redistribution line in a second direction, the second direction perpendicular to the first direction.

4. The device of claim 1, wherein the second redistribution line is a functional redistribution line, and the dielectric layer is disposed between the under bump metallization and the functional redistribution line.

5. The device of claim 1, wherein the second redistribution line is a dummy redistribution line, and the dielectric layer is disposed between the under bump metallization and the dummy redistribution line.

6. The device of claim 1, wherein a center of the bump portion is laterally aligned with the center of the first via portion and the center of the second via portion.

7. The device of claim 1, wherein a center of the bump portion is laterally offset from the center of the first via portion and the center of the second via portion.

8. The device of claim 1, wherein the under bump metallization has an extension portion between the first redistribution line and the second redistribution line.

9. The device of claim 1, wherein the first trace portion and the second trace portion extend lengthwise along the passivation layer in a same direction.

10. A device comprising:
  a first passivation layer over a semiconductor substrate;
  a first redistribution line over and extending along the first passivation layer, the first redistribution line having a first width;
  a second redistribution line over and extending along the first passivation layer, the second redistribution line having a second width, the second redistribution line separated from the first redistribution line by a first distance;

a first dielectric layer over the first redistribution line, the second redistribution line, and the first passivation layer;

an under bump metallization over the first dielectric layer, the under bump metallization coupled to the first redistribution line and the second redistribution line, the under bump metallization having a third width, the third width being greater than the sum of the first width, the second width, and the first distance; and a package substrate bonded to the under bump metallization.

11. The device of claim 10, further comprising:

a second passivation layer between the first passivation layer and the semiconductor substrate; and a passive device between the second passivation layer and the first passivation layer.

12. The device of claim 10, wherein the first dielectric layer comprises an oxide or a nitride, the device further comprising:

a second dielectric layer between the first dielectric layer and the under bump metallization, the first dielectric layer and the second dielectric layer filling an area between the first redistribution line and the second redistribution line.

13. The device of claim 10, wherein the first dielectric layer comprises a polyimide, the device further comprising:

a second dielectric layer between the first dielectric layer and the first passivation layer, the first dielectric layer and the second dielectric layer filling an area between the first redistribution line and the second redistribution line.

14. The device of claim 10, wherein the first dielectric layer fills an area between the first redistribution line and the second redistribution line.

15. The device of claim 10, wherein the under bump metallization has a bump portion and an extension portion, the bump portion disposed over the first dielectric layer, the extension portion disposed between the first redistribution line and the second redistribution line, the first dielectric layer and the extension portion filling an area between the first redistribution line and the second redistribution line.

16. A method comprising:

depositing a first passivation layer over a semiconductor substrate;

forming a first redistribution line and a second redistribution line over and extending along the first passivation layer;

forming a dielectric layer over the first redistribution line and the second redistribution line;

patterning a first opening and a second opening in the dielectric layer, the first opening exposing the first redistribution line, the second opening exposing the second redistribution line;

forming an under bump metallization in the first opening and the second opening, the under bump metallization overlapping the first redistribution line and the second redistribution line; and bonding a package substrate to the under bump metallization with a conductive connector.

17. The method of claim 16, wherein forming the first redistribution line and the second redistribution line comprises:

patterning a third opening and a fourth opening in the first passivation layer; and plating the first redistribution line in the third opening and the second redistribution line in the fourth opening, wherein a center of the first opening is laterally aligned with a center of the third opening, and wherein a center of the second opening is laterally aligned with a center of the fourth opening.

18. The method of claim 16, wherein the under bump metallization is formed in an area between the first redistribution line and the second redistribution line.

19. The method of claim 16, wherein forming the dielectric layer comprises depositing an oxide or a nitride.

20. The method of claim 16, wherein forming the dielectric layer comprises spinning on a polyimide.

* * * * *